United States Patent
Soeya et al.

(10) Patent No.: US 9,490,428 B2
(45) Date of Patent: Nov. 8, 2016

(54) PHASE-CHANGE MEMORY AND SEMICONDUCTOR RECORDING/REPRODUCING DEVICE

(71) Applicant: National Institute of Advanced Industrial Science and Technology, Tokyo (JP)

(72) Inventors: Susumu Soeya, Ibaraki (JP); Toshimichi Shintani, Ibaraki (JP); Takahiro Odaka, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 166 days.

(21) Appl. No.: 14/171,033

(22) Filed: Feb. 3, 2014

(65) Prior Publication Data

US 2015/0144865 A1    May 28, 2015

(30) Foreign Application Priority Data

Nov. 26, 2013  (JP) ................................ 2013-243877

(51) Int. Cl.
*H01L 29/18* (2006.01)
*H01L 29/00* (2006.01)
(Continued)

(52) U.S. Cl.
CPC ......... *H01L 45/144* (2013.01); *H01L 27/2436* (2013.01); *H01L 45/06* (2013.01); *H01L 45/1608* (2013.01)

(58) Field of Classification Search
CPC . H01L 45/06; H01L 45/114; H01L 45/1233; H01L 45/143; H01L 45/148; H01L 45/04; H01L 45/1253; H01L 45/1683; H01L 43/00; H01L 27/22; H01L 29/82; H01L 27/00; H01L 43/02; G11C 11/5678; G11C 13/0004; G11C 2213/71; G11C 11/02; G11C 11/5607; H03K 23/76; H03K 3/45; H03K 19/16; H03K 17/80; G01R 33/00; G01R 33/06; B81B 3/0091
USPC ........... 365/163, 148; 257/E21.068; 438/102
See application file for complete search history.

(56) References Cited

U.S. PATENT DOCUMENTS 7,456,421 B2 * 11/2008 Lung .................... H01L 27/2436
257/200
7,608,503 B2 * 10/2009 Lung .................... H01L 27/112
257/167

(Continued)

FOREIGN PATENT DOCUMENTS

JP    2010263131 A    11/2010
JP    2014-175528 A    9/2014

OTHER PUBLICATIONS

Article entitled "Interfacial phase-change memory" by R. E. Simpson et el., Nature Nanotechnology, vol. 6, 2011, pp. 501-505.

(Continued)

*Primary Examiner* — Mary Wilczewski
*Assistant Examiner* — Tsz Chiu
(74) *Attorney, Agent, or Firm* — McCormick, Paulding & Huber LLP

(57) ABSTRACT

Technology capable of improving performance of a phase-change memory is provided. A recording/reproducing film contains Sn (tin), Sb (antimony), and Te (tellurium) and also contains an element X having a bonding strength with Te stronger than a bonding strength between Sn and Te and a bonding strength between Sb and Te. Here, the recording/reproducing film has a (SnXSb)Te alloy phase, and this (SnXSb)Te alloy phase includes a self-assembled superlattice structure.

4 Claims, 15 Drawing Sheets

(51) Int. Cl.
*H01L 45/00* (2006.01)
*H01L 27/24* (2006.01)

(56) References Cited

U.S. PATENT DOCUMENTS

| | | | | |
|---|---|---|---|---|
| 9,082,970 | B2* | 7/2015 | Soeya | H01L 45/144 |
| 2003/0152866 | A1* | 8/2003 | Ogawa | G11B 7/2403 |
| | | | | 430/270.13 |
| 2008/0001136 | A1* | 1/2008 | Chong | G11C 11/16 |
| | | | | 257/4 |
| 2008/0291718 | A1* | 11/2008 | Liu | H01L 45/06 |
| | | | | 365/163 |
| 2010/0279053 | A1* | 11/2010 | Tsuchino | C23C 14/0623 |
| | | | | 428/64.5 |
| 2012/0104325 | A1* | 5/2012 | Talapin | B82Y 30/00 |
| | | | | 252/502 |
| 2014/0252304 | A1 | 9/2014 | Soeya et al. | |

OTHER PUBLICATIONS

Article entitled "The first Principle Computer Simulation and Real Device Characteristics of Superlattice Phase-Change Memory" by J. Tominaga, et al., Proceedings of the IEEE International Electron Device Meeting, 2010, pp. 22.3.1-22.3.4.

Article entitled "Ultra-low switching power, crystallographic analysis, and switching mechanism for SnXTe100-X/Sb2Te3 diluted superlattice system" by Susumu Soeya et al., Applied Physics Letters, vol. 103, 053103, 5 pages.

* cited by examiner

| Recording/Reproducing Film | Phase Transition Temperature(°C) |
|---|---|
| SnTe/Sb$_2$Te$_3$ Superlattice Film | 85 |
| GST225 Film | 145 |
| GeTe/Sb$_2$Te$_3$ Superlattice Film | 165 |
| Sn$_{25}$Ge$_{25}$Te$_{50}$/Sb$_2$Te$_3$ Superlattice Film | 150 |
| Sn$_{45}$Al$_5$Te$_{50}$/Sb$_2$Te$_3$ Superlattice Film | 145 |
| Sn$_{45}$Ge$_5$Te$_{50}$/Sb$_2$Te$_3$ Superlattice Film | 150 |

PHASE-CHANGE MEMORY AND SEMICONDUCTOR RECORDING/REPRODUCING DEVICE

CROSS-REFERENCE TO RELATED APPLICATION

The present application claims priority from Japanese Patent Application No. 2013-243877 filed on Nov. 26, 2013, the content of which is hereby incorporated by reference into this application.

TECHNICAL FIELD OF THE INVENTION

The present invention relates to a phase-change memory and a semiconductor recording/reproducing device.

BACKGROUND OF THE INVENTION

Phase-change memory is promising as a next-generation non-volatile memory (hereinafter, abbreviated as PCRAM: Phase-Change Random Access Memory) because it is superior in scaling of element size and endurance. However, PCRAM has a problem of high reset current.

To solve this problem, superlattice phase-change memory composed of GeTe(111)/$Sb_2Te_3$(001) superlattice film and called "interfacial Phase-Change Memory (iPCM)" has been suggested. Such a superlattice phase-change memory, as compared with a phase-change memory called GST225 (abbreviation of $Ge_2Sb_2Te_5$) an operation mechanism of which is phase-changes between "amorphous" and "crystal", can reduce switching power to about one tenth (1/10) according to first-principle computer simulations and verification experiments.

According to Simpson et al., Nature Nanotechnology 6, 401 (2011) (Non-Patent Document 1), Tominaga et al., Proceeding of the IEEE International Electron Device Meeting, San Francisco (2010), pp. 22.3.1-22.3.4 (Non-Patent Document 2) and Japanese Patent Application Laid-Open Publication No. 2010-263131 (Patent Document 1), operation principle of the superlattice phase-change memory using a superlattice formed of GeTe(111) and $Sb_2Te_3$(001) is to reversibly change Ge atoms between "the octahedral sites (or 6-fold bond state)" and "the tetrahedral sites (or 4-fold bond state)" by an applied voltage or current. This change will be called "Ge switching" in the present specification. In addition, the superlattice phase-change memory using a superlattice formed of GeTe(111) and $Sb_2Te_3$(001) will be called in a simple manner as GeTe(111)/$Sb_2Te_3$(001).

These Documents mentioned above disclose that, since the superlattice phase-change memory exhibits a low resistance when Ge atoms are at the octahedral sites while it exhibits a high resistance when Ge atoms are at tetrahedral sites, it is possible to make the superlattice phase-change memory function in a set state when it is in a low-resistance state and function in a reset state when it is in a high-resistance state. That is, by the superlattice phase-change memory, information can be memorized by making a correspondence between the low-resistance state and the low-resistance state and "0" and "1", which are digital values, respectively.

According to these Documents mentioned above, a $Sb_2Te_3$(001) layer is formed by layer-by-layer deposition of a Te (tellurium) layer and a Sb (antimony) layer in $Sb_2Te_3$[001] except for a Te—Te weak bond portion where a van der Waals gap layer is present. On the other hand, the GeTe(111) layer is formed by layer-by-layer deposition of a Te layer and a Ge (germanium) layer except for a deposited portion of a Te layer-Te layer where a vacancy layer exists.

Further, Patent Document 1 mentioned above discloses that, upon "Ge switching", lattice (or crystalline lattice) modification between the 6-fold bond state of Ge atoms in which the deposited state in GeTe[111] direction is "—Ge layer-Te layer-vacancy layer-Te layer-Ge layer-" and the 4-fold bond state of Ge atoms in which the deposited state in GeTe[111] direction is "—Te layer-Ge layer-vacancy layer-Ge layer-Te layer-" is induced and it enables a low switching power of the superlattice phase-change memory. Here, the 6-fold bond state of Ge atoms corresponds to the low-resistance state and the 4-fold bond state of Ge atoms corresponds to the high-resistance state.

SUMMARY OF THE INVENTION

Phase-change memory represented by GST225 which is currently being commercialized has an operation principle of generating phase-changes between "amorphous" state and "crystal" state in a recording/reproducing film. However, consumed power, represented by switching power, of this type of phase-change memory is high and thus reduction of consumed powers is demanded.

As to this point, while the GeTe(111)/$Sb_2Te_3$(001) superlattice phase-change memory described above has been proposed and the capability of a reduction of switching power to about one tenth as compared with that of GST225 that is an existing phase-change memory has been substantiated, further reduction of consumed power is demanded.

A preferred aim of the present invention is to provide technique capable of improving performance of a phase-change memory.

The above and other problems and novel characteristics of the present invention will be apparent from the description of the present specification and the accompanying drawings.

A phase-charge memory according to an embodiment includes a recording/reproducing film containing Sn (tin), Sb (antimony), and Te (tellurium) and also containing an element X having a bonding strength with Te stronger than a bonding strength between Sn and Te and a bonding strength between Sb and Te. Here, the recording/reproducing film has a (SnXSb)Te alloy phase, and this (SnXSb)Te alloy phase includes a self-assembled superlattice structure.

Also, the phase-change memory in an embodiment includes a recording/reproducing film containing Sn, Sb, and Te and also containing an element X. Here, the recording/reproducing film has a (SnXSb)Te alloy phase, and the (SnXSb)Te alloy phase includes a self-assembled superlattice structure. And, the element X is any of Ge (germanium), Al (aluminum), Mn (manganese), Cr (chromium), Mo (molybdenum), Nb (niobium), V (vanadium), and Si (silicon).

A semiconductor recording/reproducing device in an embodiment includes a plurality of memory cells. In the semiconductor recording/reproducing device in an embodiment, the plurality of memory cells each includes (a) a selection transistor for selecting a memory cell, and (b) a memory unit electrically connected to the selection transistor, the memory unit including a recording/reproducing film containing Sn, Sb, and Te and also containing an element X having a bonding strength with Te stronger than a bonding strength between Sn and Te and a bonding strength between Sb and Te. Here, the recording/reproducing film has a (SnXSb)Te alloy phase, and the (SnXSb)Te alloy phase includes a self-assembled superlattice structure.

Also, a semiconductor recording/reproducing device in an embodiment includes a plurality of memory cells. In the semiconductor recording/reproducing device, the plurality of memory cells each includes (a) a selection transistor for selecting a memory cell, and (b) a memory unit electrically connected to the selection transistor, the memory unit including a recording/reproducing film containing Sn, Sb, and Te and containing an element X. Here, the recording/reproducing film has a (SnXSb)Te alloy phase, and the (SnXSb)Te alloy phase includes a self-assembled superlattice structure. And, the element X is any of Ge, Al, Mn, Cr, Mo, Nb, V, and Si.

According to an embodiment, performance of a phase-change memory can be improved.

BRIEF DESCRIPTIONS OF THE DRAWINGS

DESCRIPTIONS OF THE PREFERRED EMBODIMENTS

Figure 1:
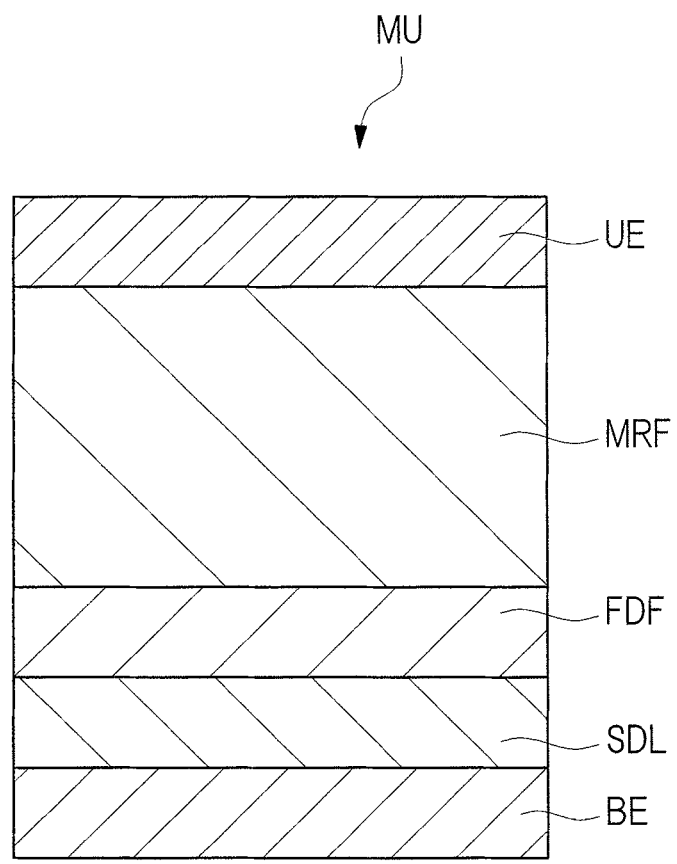
FIG. 1 is a cross-sectional view illustrating a schematic configuration of a memory portion that is a main part of a phase-change memory according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols in principle throughout the drawings for describing the embodiments, and a repetitive description thereof is omitted. Moreover, in some drawings used in the embodiments, hatching is used even in a plan view so as to make the drawings easy to see.

(First Embodiment)

<Description of Related Art>

For example, Japanese Patent Application No. 2013-048050 (Patent Document 2) and Soeya et al., Appl. Phys. Lett. 103, 053103 (2013) (Non-Patent Document 3) describe a phase-change memory configuring a recording/reproducing film from a film containing Sn (tin), Sb (antimony), and Te (tellurium). Specifically, Patent Document 2 mentioned above describes a superlattice phase-change memory in which a $Sn_xTe_{100-x}/Sb_2Te_3$ superlattice film formed by alternately laminating a $Sn_xTe_{100-x}$ film and a $Sb_2Te_3$ film is used as a recording/reproducing film. Here, the superlattice phase-change memory described in Patent Document 2 is referred to as a $Sn_xTe_{100-x}/Sb_2Te_3$ superlattice phase-change memory.

In Patent Document 2 mentioned above, it is described that the $Sn_xTe_{100-x}/Sb_2Te_3$ superlattice film is configured to include a SnTe/$Sb_2Te_3$ superlattice phase made of SnTe and $Sb_2Te_3$ and a SnSbTe alloy phase, and a Te phase and the SnTe/$Sb_2Te_3$ superlattice phase is diluted with the SnSbTe alloy phase and the Te phase. And, according to Patent Document 2 mentioned above, power consumption can be reduced to approximately 1/7070 at maximum as compared with the existing GST225. That is, the $Sn_xTe_{100-x}/Sb_2Te_3$ superlattice phase-change memory can significantly reduce power consumption more than not only the existing GST225 but also the GeTe(111)/$Sb_2Te_3$(001) superlattice phase-change memory, and is so much expected in view of improvement in performance of the phase-change memory.

<New Findings by the Inventors>

However, in Patent Document 2 described above, the low power operation mechanism of the $Sn_xTe_{100-x}/Sb_2Te_3$ superlattice phase-change memory has not been completely elucidated, describing that there may be (1) a possibility of a low power operation in a SnTe/$Sb_2Te_3$ superlattice phase and (2) a possibility of a low power operation in a SnSbTe alloy phase.

Regarding this point, as a result of further studies by the inventors, it turned out that there is a high possibility that this recording/reproducing film has only a slight SnTe/$Sb_2Te_3$ superlattice phase and is configured mostly of the SnSbTe alloy phase. Thus, it is presumed that there is a high possibility that the self-assembled superlattice structure is configured not of the SnTe/$Sb_2Te_3$ superlattice phase but of the SnSbTe alloy phase. And, according to the $Sn_xTe_{100-x}$/$Sb_2Te_3$ superlattice phase-change memory, by the low power operation mechanism in which "Sn switching" occurs in the self-assembled superlattice structure included in the SnSbTe alloy phase, power consumption can be reduced to approximately 1/7070 at maximum as compared with the existing GST225.

Here, the "self-assembled superlattice structure" is defined as structure including a structure in which at least a first sublattice including a Van der Waals gap layer and a second sublattice including a vacancy layer are adjacent to each other in a superlattice growth direction. Specifically, the deposition sequence of the self-assembled superlattice structure of the SnSbTe alloy phase is, for example, from bottom to top, "—Te layer-(Sn, Sb) layer-Te layer-Van der Waals gap layer-Te layer-(Sn, Sb) layer-Te layer-(Sn, Sb) layer-Te layer-vacancy layer-Te layer-(Sn, Sb) layer-Te layer-".

The low power operation mechanism in which "Sn switching" occurs in the self-assembled superlattice structure included in the SnSbTe alloy phase is considered to be the one as follows. That is, with the voltage and current applied to the $Sn_xTe_{100-x}$/$Sb_2Te_3$ superlattice phase-change memory, lattice modification is induced between the 6-fold bond state of Sn atoms in which the deposited state in a superlattice growth direction is "—(Sn, Sb) layer-Te layer-vacancy layer-Te layer-(Sn, Sb) layer-" and the 4-fold bond state of Sn atoms in which the deposited state in a superlattice growth direction is "—Te layer-(Sn, Sb) layer-vacancy layer-(Sn, Sb) layer-Te layer-" ("Sn switching"). Here, it is considered that the vacancy layer functions as a layer where insertion and desorption of Sn is performed and the Van der Waals gap layer functions as a buffer layer mitigating a volume change due to the insertion and desorption of Sn in the vacancy layer. According to this $Sn_xTe_{100-x}$/$Sb_2Te_3$ superlattice phase-change memory, "Sn switching" occurs even if the voltage and current to be applied are small, thereby allowing a low power operation. That is, in the $Sn_xTe_{100-x}$/$Sb_2Te_3$ superlattice phase-change memory, the state is such that Sn atoms easily move between the 6-fold bond state of Sn atoms and the 4-fold bond state of Sn atoms, and therefore it is considered that "Sn switching" occurs even if the voltage and current to be applied are small.

<Room for Improvement>

Such easy movability of Sn atoms as described above is useful in view of achieving a low power operation of the $Sn_xTe_{100-x}$/$Sb_2Te_3$ superlattice phase-change memory. However, in view of retention characteristics, that is, data retention characteristics, there is room for improvement.

For example, in the $Sn_xTe_{100-x}$/$Sb_2Te_3$ superlattice phase-change memory, the 6-fold bond state of Sn atoms corresponds to a low-resistance state, and the 4-fold bond state of Sn atoms corresponds to a high-resistance state. In the $Sn_xTe_{100-x}$/$Sb_2Te_3$ superlattice phase-change memory, information is stored by associating the low-resistance state and the high-resistance state with digital values of "0" and "1", respectively.

However, in this $Sn_xTe_{100-x}$/$Sb_2Te_3$ superlattice phase-change memory, since Sn atoms easily move, a phenomenon occurs, for example, in which the 4-fold bond state (high-resistance state) is changed to the 6-fold bond state (low-resistance state) at a relatively low temperature (on the order of 85 degrees Celsius). This phenomenon is hereinafter referred to as a phase transition. When the temperature becomes higher than or equal to a phase-transition temperature at which a phase transition occurs, the stored information is lost in the $Sn_xTe_{100-x}$/$Sb_2Te_3$ superlattice phase-change memory. Therefore, the retention characteristics representing information retention characteristics are degraded as the phase-transition temperature becomes lower. In other words, as the phase-transition temperature becomes higher, the retention characteristics are improved. Regarding this point, the phase-transition temperature is low in the $Sn_xTe_{100-x}$/$Sb_2Te_3$ superlattice phase-change memory, and therefore there is room for improvement in view of improving the retention characteristics.

Therefore, in the first embodiment, contrivance capable of improving the retention characteristics in the $Sn_xTe_{100-x}$/$Sb_2Te_3$ superlattice phase-change memory is provided. In the following, the technical idea with this contrivance in the first embodiment will be described.

<Structure of the Memory Unit of the Phase-Change Memory>

FIG. 1 is a cross-sectional view illustrating a schematic configuration of the memory unit that is a main part of the phase-change memory according to the first embodiment. As illustrated in FIG. 1, a memory unit MU has a lower electrode BE, and a seed layer SDL is formed on this lower electrode BE. On this seed layer SDL, an underlayered film FDF is formed, and a recording/reproducing film MRF is formed on the underlayered film FDF. Furthermore, an upper electrode UE is formed on the recording/reproducing film MRF. These films can be formed by sputtering.

The lower electrode BE is configured of, for example, a tungsten film (W film), and has a film thickness of, for example, 100 nm. The seed layer SDL is configured of, for example, a titanium nitride film (TiN film), and has a film thickness of, for example, 1 nm. This seed layer SDL has a function of making the underlayered film FDF and the recording/reproducing film MRF formed above the seed layer SDL have a crystalline orientation with closed packed hexagonal sheet. Furthermore, the underlayered film FDF is configured of, for example, a $Sb_2Te_3$ film, and has a film thickness of, for example, 10 nm. As with the seed layer SDL, this underlayered film FDF has a function of making the recording/reproducing film MRF formed above the seed layer SDL have a crystalline orientation with closed packed hexagonal sheet. The upper electrode UE formed on the recording/reproducing film MRF is formed of, for example, a tungsten film, and has a film thickness of, for example, 50 nm.

Figure 2:
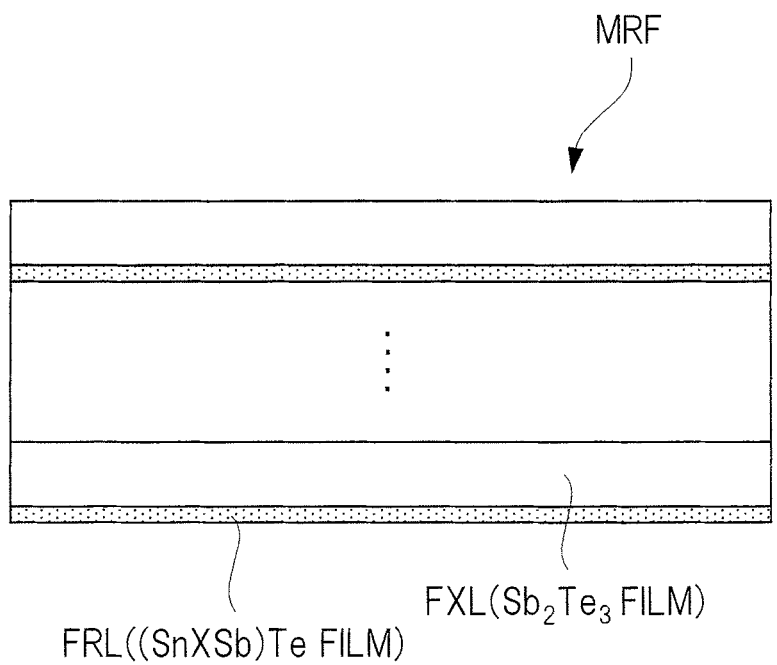
FIG. 2 is a diagram illustrating a recording/reproducing film according to the first embodiment.

The recording/reproducing film MRF in the first embodiment is configured of a film containing Sn (tin), Sb (antimony), and Te (tellurium) and also containing an element X. FIG. 2 is a diagram illustrating a method of forming the recording/reproducing film MRF according to the first embodiment. As illustrated in FIG. 2, the recording/reproducing film MRF is formed by alternately laminating a free layer FRL and a pinned layer FXL by using, for example, sputtering. That is, the recording/reproducing film MRF is formed so as to configure a superlattice film.

Here, the free layer FRL is configured of a (SnXSb)Te film, and has a film thickness of, for example, approximately 1 nm. On the other hand, the pinned layer FXL is configured of a $Sb_2Te_3$ film, and has a film thickness of, for example, approximately 4 nm. In the specification, this superlattice film is referred to as a (SnXSb)Te/$Sb_2Te_3$ superlattice film.

This (SnXSb)Te/$Sb_2Te_3$ superlattice film has a total film thickness of, for example, 45 nm.

Figure 3:
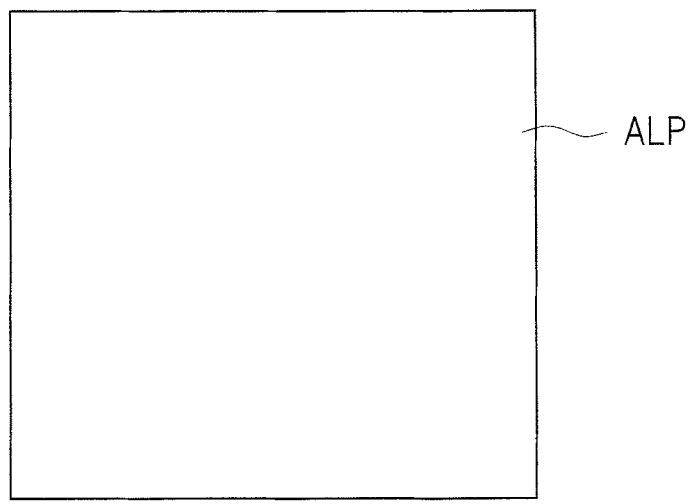
FIG. 3 is a diagram schematically illustrating a (SnXSb)Te alloy phase.

The recording/reproducing film MRF in the first embodiment is formed of the (SnXSb)Te/$Sb_2Te_3$ superlattice film as illustrated in FIG. 2. However, FIG. 2 schematically illustrates the method of manufacturing a (SnXSb)Te/$Sb_2Te_3$ superlattice film, and the actual structure of the recording/reproducing film MRF is different from the schematic structure illustrated in FIG. 2. That is, the (SnXSb)Te/$Sb_2Te_3$ superlattice film formed by the method illustrated in FIG. 2 does not have the structure illustrated in FIG. 2. Actually, the (SnXSb)Te/$Sb_2Te_3$ superlattice film is configured of a (SnXSb)Te alloy phase ALP illustrated in FIG. 3. Also, the (SnXSb)Te alloy phase ALP includes a self-assembled superlattice structure. As such, the recording/reproducing film MRF in the first embodiment is configured of the (SnXSb)Te/$Sb_2Te_3$ superlattice film containing Sn, Sb, and Te and also containing the element X, and this (SnXSb)Te/$Sb_2Te_3$ superlattice film is configured to be occupied mostly by the (SnXSb)Te alloy phase ALP including the self-assembled superlattice structure.

That is, a SnSbTe/$Sb_2Te_3$ superlattice film not containing the element X is configured of a SnSbTe alloy phase, and this SnSbTe alloy phase is configured to include a self-assembled superlattice structure. Regarding this point, in the first embodiment, the (SnXSb)Te/$Sb_2Te_3$ superlattice film is also configured of the (SnXSb)Te alloy phase ALP, and this (SnXSb)Te alloy phase ALP includes a self-assembled superlattice structure. That is, the element X added in the first embodiment is at least required to be an element where the self-assembled superlattice structure is kept in the (SnXSb)Te/$Sb_2Te_3$ superlattice film (a first condition). Specifically, an example of this element X is an element placed in the (Sn, Sb) layer included in the self-assembled superlattice structure to configure a (Sn, X, Sb) layer.

In this manner, in the (SnXSb)Te/$Sb_2Te_3$ superlattice film, with a mechanism equivalent to the low-voltage operation mechanism of the SnSbTe/$Sb_2Te_3$ superlattice film, it is possible to perform a low-voltage operation in the (SnXSb)Te/$Sb_2Te_3$ superlattice phase-change memory using the (SnXSb)Te/$Sb_2Te_3$ superlattice film as the recording/reproducing film MRF. That is, also in the (SnXSb)Te/$Sb_2Te_3$ superlattice film, "Sn switching" in the self-assembled superlattice structure included in the (SnXSb)Te alloy phase can be induced, thereby achieving a low power operation in the superlattice phase-change memory. Here, a superlattice phase-change memory using the (SnXSb)Te/$Sb_2Te_3$ superlattice film as the recording/reproducing film MRF is referred to as a (SnXSb)Te/$Sb_2Te_3$ superlattice phase-change memory.

<Feature of First Embodiment>

A feature of the first embodiment is that the element X satisfying the above-described first condition is an element having a bonding strength with Te stronger than a bonding strength between Sn and Te and a bonding strength between Sb and Te (a second condition). In this manner, according to the (SnXSb)Te/$Sb_2Te_3$ superlattice phase-change memory in the first embodiment, by introducing the element X satisfying the above-described first and second conditions, the retention characteristics can be improved.

The reason for this as follows. In the (Sn, X, Sb) layer of a self-assembled superlattice structure with the element X introduced thereto, the element X having a bonding strength with Te stronger than the bonding strength between Sn and Te and the bonding strength between Sb and Te, since the bonding between the element X and Te is strong, a wave function of the bonding between the element X and Te exudates to strengthen the chemical bonding strength among the atoms in the (Sn, X, Sb) layer. In other words, the strong bonding between the element X and Te means that an electron cloud extends, and the influence of the extending electron cloud strengthens the chemical bonding strength among the atoms in the (Sn, X, Sb) layer. This means that the Sn atoms in the (Sn, X, Sb) layer are difficult to move, and thereby a phase transition is less prone to occur. That is, according to the first embodiment, the phase-transition temperature at which a phase transition occurs is increased. In this manner, according to the (SnXSb)Te/$Sb_2Te_3$ superlattice phase-change memory in the first embodiment, the retention characteristics can be improved.

As such, according to the first embodiment, retention characteristics can be improved. The reason for this is that the element X having the bonding strength with Te stronger than the bonding strength between Sn and Te and the bonding strength between Sb and Te is introduced into the (Sn, Sb) layer having the self-assembled superlattice structure to form the (Sn, X, Sb) layer, thereby strengthening the chemical bonding strength among the atoms in the (Sn, X, Sb) layer. As a result, the Sn atoms in the (Sn, X, Sb) layer become difficult to move to increase the phase-transition temperature. On the other hand, it can be considered that the difficulty of the movement of the Sn atoms may seemingly make it difficult to cause the low power operation of "Sn switching" by applying a voltage and current.

However, according to the first embodiment, the low power operation of "Sn switching" can also be achieved. The reason for this will be described below. As described above, in the first embodiment, the element X having the bonding strength with Te stronger than the bonding strength between Sn and Te and the bonding strength between Sb and Te is introduced into the (Sn, Sb) layer having the self-assembled superlattice structure to form the (Sn, X, Sb) layer. In this manner, the chemical bonding strength among the atoms in the (Sn, X, Sb) layer becomes strong, and the Sn atoms become difficult to move. It can be considered to mean that the Sn atoms contributing to "Sn switching" due to application of voltage and current are decreased. That is, it can be considered that, in the first embodiment, as a result of strengthening the bonding strength among the atoms by introducing the element X, the Sn atoms being movable by "Sn switching" are decreased. This means that "Sn switching" can be induced with low power, thereby allowing a low power operation of the (SnXSb)Te/$Sb_2Te_3$ superlattice phase-change memory.

Furthermore, the decrease of the Sn atoms movable by "Sn switching" can be regarded as a reduction in atom % of Sn in the (SnXSb)Te/$Sb_2Te_3$ superlattice phase-change memory. Regarding this point, Patent Document 2 mentioned above describes that the low power operation is accelerated by decreasing the atom % of Sn in the $Sn_xTe_{100-x}$/$Sb_2Te_3$ superlattice phase-change memory. Therefore, also on the analogy of Patent Document 2, it is possible to think that the low power operation becomes possible according to the (SnXSb)Te/$Sb_2Te_3$ superlattice phase-change memory.

According to the foregoing, according to the (SnXSb)Te/$Sb_2Te_3$ superlattice phase-change memory in the first embodiment, it is possible to obtain a distinguished effect of being capable of improving the retention characteristics while achieving the low power operation is achieved. That is, according to the first embodiment, the performance of the phase-change memory can be improved.

Here, as described above, a feature of the first embodiment is that the element X satisfying the above-described first condition is an element having a bonding strength with Te stronger than the bonding strength between Sn and Te and the bonding strength between Sb and Te. Here, the strong bonding strength with Te more than the bonding strength between Sn and Te and the bonding strength between Sb and Te can be evaluated based on, for example, the magnitude of standard free energy of formation serving as an indicator of bonding energy among elements. That is, the strong bonding among elements means large bonding energy, which corresponds to a large absolute value of standard free energy of formation. Thus, for example, standard free energy of formation of a Sn oxide is taken as $\Delta G°(Sn)$, standard free energy of formation of a Sb oxide is taken as $\Delta G°(Sb)$, and standard free energy of formation of an oxide of the element X is taken as $\Delta G°(X)$. In this case, the strong bonding strength with Te more than the bonding strength between Sn and Te and the bonding strength between Sb and Te indirectly corresponds to the point that the absolute value of $\Delta G°(X)$ is larger than the absolute value of $\Delta G°(Sn)$ and is larger than the absolute value of $\Delta G°(Sb)$. Here, the standard free energies of formation of oxides generally obtainable with ease are taken, and the relation among the standard free energies of formation of oxides tends to be similar to the relation among standard free energies of formation of sulfides, which are compounds of oxygen atoms and sulfur atoms which are related to oxygen atoms. Also, it can be considered that tellurium compounds, which are compounds of oxygen atom, sulfur atoms, and tellurium atoms which are related to oxygen and sulfur atoms exhibit a similar tendency. From this, it can be considered that the strong bonding strength with Te more than the bonding strength between Sn and Te and the bonding strength between Sb and Te indirectly corresponds to the point that the absolute value of $\Delta G°(X)$ is larger than the absolute value of $\Delta G°(Sn)$ and also larger than the absolute value of $\Delta G°(Sb)$.

As described above, the technical idea in the first embodiment can be widely applied to the (SnXSb)Te/$Sb_2Te_3$ superlattice phase-change memory including a recording/reproducing film containing the element X satisfying the above-described first and second conditions, the recording/reproducing film having a (SnXSb)Te alloy phase which has a self-assembled superlattice structure.

In the following, description is made, regarding typical elements as the element X satisfying the above-described first and second conditions, to a point that the retention characteristics of the (SnXSb)Te/$Sb_2Te_3$ superlattice phase-change memory can be improved by adopting the (SnXSb)Te/$Sb_2Te_3$ superlattice film as the recording/reproducing film MRF based on experimental data.

<Example 1: The Case of the Element X=Ge Atom>

Figure 4:
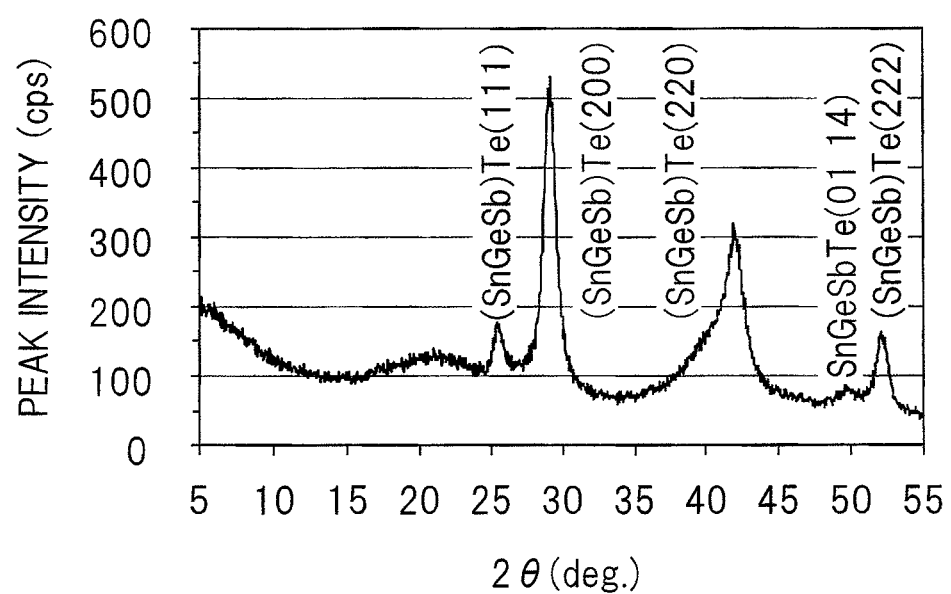
FIG. 4 is a diagram illustrating an X-ray diffraction profile of a (SnGeSb)/$Sb_2Te_3$ superlattice film when an element X is Ge.

FIG. 4 is a diagram illustrating an X-ray diffraction profile of the (SnGeSb)/$Sb_2Te_3$ superlattice film when the element X is Ge. As illustrated in FIG. 4, only a peak of a NaCl-type (SnGeSb)Te alloy phase is observed. From this, it can be found that a (SnGeSb)/$Sb_2Te_3$ superlattice film is configured mostly of a (SnGeSb)Te alloy phase. Since any other phase is not observed in FIG. 4, it can be considered that Ge has been solutionized in the (Sn, Sb) layer in the (SnGeSb)Te alloy phase.

Next, the results of crystallographic microstructure analysis of the NaCl-type (SnGeSb)Te alloy phase having the peak illustrated in FIG. 4 are described. For crystallographic microstructure analysis, for example, a method described in "J. Appl. Phys. 112, 034301 (2012)" is used. Specifically, in this crystallographic microstructure analysis, a search was made for a crystalline structure satisfying $(I_{111}/I_{222})_{Obs} \approx (I_{111}/I_{222})_{Cal}$ and $0.7 \leq S \leq 1$ ($\pm 0.1$). Here, $I_{111}$ indicates a (111)-peak integral intensity, and $I_{222}$ indicates a (222)-peak integral intensity. Also, $(I_{111}/I_{222})_{Obs}$ is an experimental integral peak intensity ratio, $(I_{111}/I_{222})_{Cal}$ is a theoretical integral peak intensity ratio, and "S" indicates a degree of order.

Figure 5:
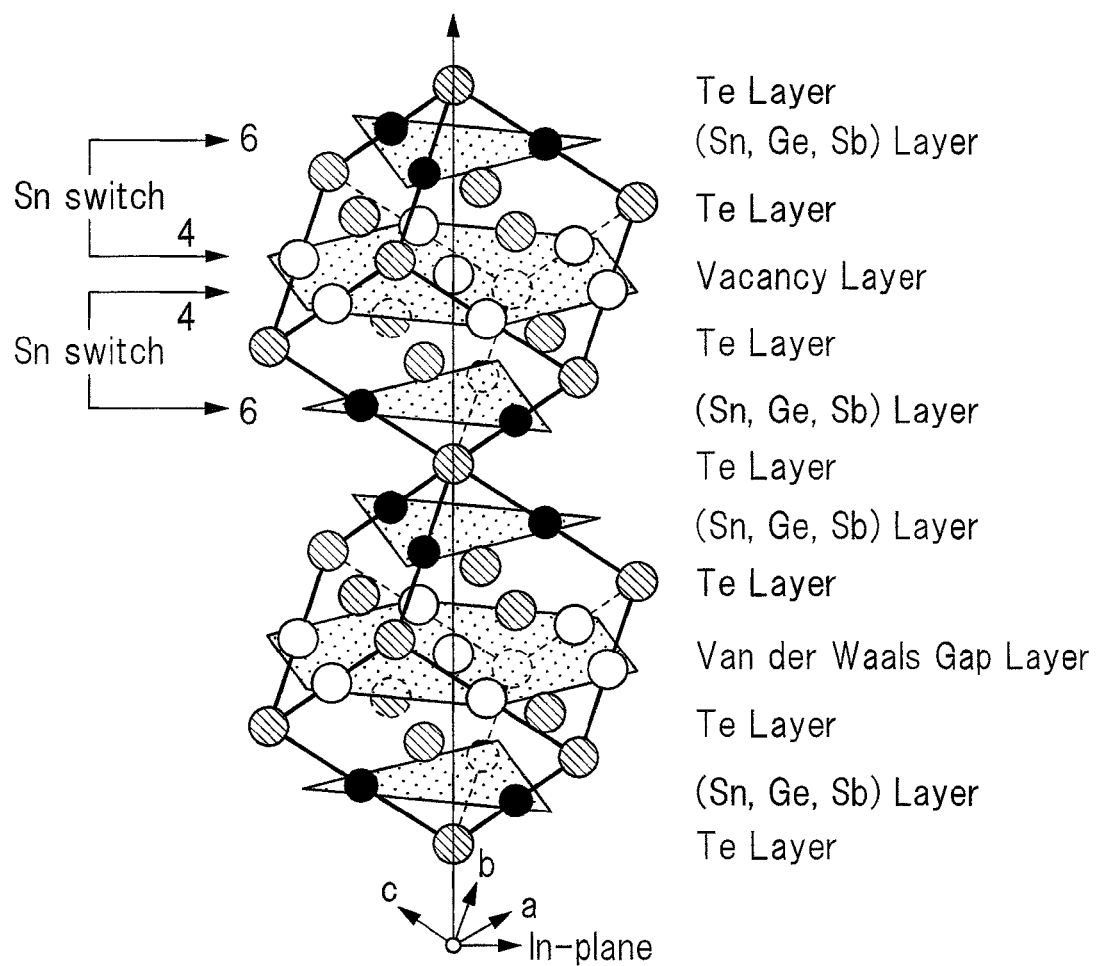
FIG. 5 is a diagram illustrating a crystalline structure of a (SnGeSb)Te alloy phase.

As a result of this crystallographic microstructure analysis, it was found that the highest potential crystalline structure as the crystalline structure of a (SnGeSb)Te alloy phase is, for example, a NaCl-type crystalline structure having a vacancy layer as illustrated in FIG. 5. Specifically, the (SnGeSb)Te alloy phase is considered to have a crystalline structure with deposition of "—Te layer-(Sn, Ge, Sb) layer-Te layer-Van der Waals gap layer-Te layer-(Sn, Ge, Sb) layer-Te layer-(Sn, Ge, Sb) layer-Te layer-vacancy layer-Te layer-(Sn, Ge, Sb) layer-Te layer" in (SnGeSb)Te[111] direction, as illustrated in FIG. 5.

In the crystalline structure of the (SnGeSb)Te alloy phase, there is a possibility that the deposition structure is changed, by using a space that is a vacancy layer, between the 6-fold bond state (As-dep. state) of Sn atoms in which the state is "—Te layer-(Sn, Ge, Sb) layer-Te layer-vacancy layer-Te layer-(Sn, Ge, Sb) layer-Te layer" and the 4-fold bond state of Sn atoms in which the state is "—Te layer-vacancy layer-Te layer-(Sn, Ge, Sb) layer-Te layer-vacancy layer-Te layer", according to the applied voltage and the applied current. That is, there is a high possibility that "Sn switching" may occur where insertion and desorption of Sn is performed in the vacancy layer in the (SnGeSb)Te alloy phase.

Also, while the vacancy layer included in the upper side of the crystalline structure is an important space layer in "Sn switching", there is a high possibility that the space on the lower side of the crystalline structure is a Van der Waals gap layer, which is a space required for functioning as a buffer layer which absorbs a volume change in "Sn switching". That is, it can be found that there is a high possibility that the (SnGeSb)Te alloy phase includes a self-assembled superlattice structure.

According to the foregoing, by using the superlattice phase-change memory using the (SnGeSb)/$Sb_2Te_3$ superlattice film as the recording/reproducing film MRF, the (SnGeSb)/$Sb_2Te_3$ superlattice film is configured of the (SnGeSb)Te alloy phase having a self-assembled superlattice structure and the low-voltage operation is possible. That is, when the element X is Ge, it can be considered that Ge is placed in the (Sn, Sb) layer included in the self-assembled superlattice structure of the (SnGeSb)Te alloy phase to configure a (Sn, Ge, Sb) layer, and thereby Ge satisfies the first condition described above.

As such, it can be found that Ge added in Example 1 is an element at least satisfying the first condition in the (SnGeSb)Te/$Sb_2Te_3$ superlattice film, keeping the self-assembled superlattice structure without breaking it when added. In this manner, in the (SnGeSb)Te/$Sb_2Te_3$ superlattice film, with a mechanism equivalent to the low-voltage operation mechanism of the $Sn_xTe_{100-x}$/$Sb_2Te_3$ superlattice film, the low-voltage operation of the (SnGeSb)Te/$Sb_2Te_3$ superlattice phase-change memory using the (SnGeSb)Te/$Sb_2Te_3$ superlattice film as the recording/reproducing film MRF is possible. That is, also in the (SnGeSb)Te/$Sb_2Te_3$ superlattice film, "Sn switching" in the self-assembled superlattice structure included in the (SnGeSb)Te alloy phase can be induced with low power. In this manner, the low power operation in the (SnGeSb)Te/$Sb_2Te_3$ superlattice phase-change memory can be achieved.

Next, according to Ge, the second condition mentioned above is also satisfied. In this manner, according to the superlattice phase-change memory using the (SnGeSb)/

Sb$_2$Te$_3$ superlattice film as the recording/reproducing film MRF, the retention characteristics can be improved, which is described below.

Figures 6, 7:
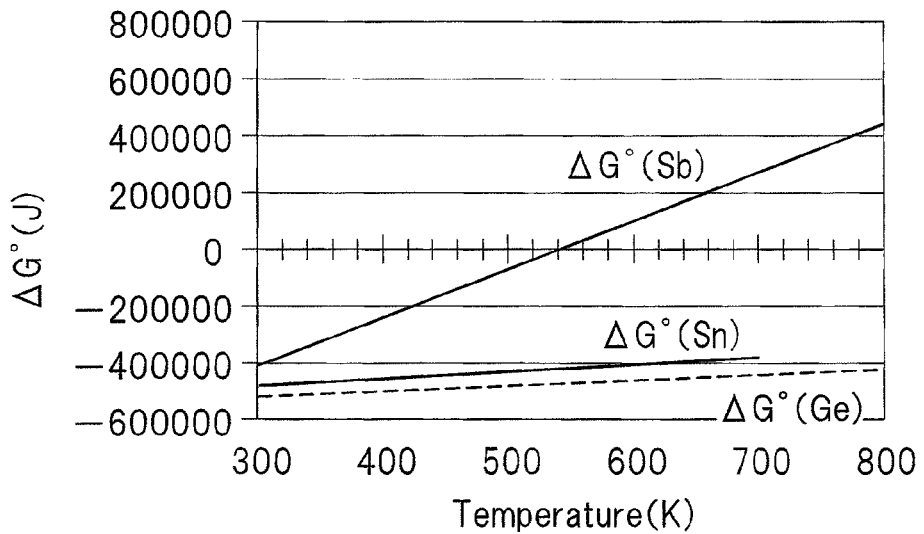
FIG. 6 is a graph illustrating temperature dependency of standard free energies of formation of a Sn oxide, a Sb oxide, and a Ge oxide.
FIG. 7 is a table of phase-change temperatures of recording/reproducing films made of various substances.

FIG. 6 is a graph illustrating temperature dependency of standard free energies of formation of a Sn oxide, a Sb oxide, and a Ge oxide. As illustrated in FIG. 6, it can be found that, over a wide temperature range (300K to 800K), the absolute value of the standard free energy of formation ΔG°(Ge) of the Ge oxide is larger than the absolute value of the standard free energy of formation ΔG°(Sn) of the Sn oxide and the absolute value of the standard free energy of formation ΔG°(Sb) of the Sb oxide. This indirectly means that the bonding strength between Ge and Te is stronger than the bonding strength between Sn and Te and the bonding strength between Sb and Te.

Therefore, Ge introduced in Example 1 is an element satisfying the above-described first and second conditions. According to the Ge-introduced (SnGeSb)Te/Sb$_2$Te$_3$ superlattice phase-change memory, the retention characteristics can be improved while a sufficient low power operation is kept, as compared with the existing GST225. The reason for this is as follows. In the (Sn, Ge, Sb) layer of the self-assembled superlattice structure with Ge introduced thereto, Ge having a bonding strength with Te stronger than the bonding strength between Sn and Te and the bonding strength between Sb and Te, since the bonding between Ge and Te is strong, a wave function of the bonding between Ge and Te exudates to strengthen the chemical bonding strength among the atoms in the (Sn, Ge, Sb) layer. In other words, the strong bonding between Ge and Te means that an electron cloud extends, and the influence of the extending electron cloud strengthens the chemical bonding strength among the atoms in the (Sn, Ge, Sb) layer. As a result, fluctuations of Sn atoms can be mitigated. In this manner, the retention characteristics of the (SnGeSb)Te/Sb$_2$Te$_3$ superlattice phase-change memory can be improved.

Specifically, FIG. 7 is a table of phase-change temperatures of recording/reproducing films made of various substances. Here, the phase-change temperature is defined as a temperature at which the structure is changed from a reset state to a set state of the phase-change memory due to the temperature increase. The reset state and the set state correspond to the high-resistance state and the low-resistance state, respectively, of the recording/reproducing film, and are associated with, for example, digital values of "0" and "1", respectively. In this manner, information (data) is stored in the recording/reproducing film of the phase-change memory. The phase-transition temperature described above is a temperature at which the reset state is changed to the set state due to the temperature change. In this manner, the information stored in the recording/reproducing film is lost. Therefore, the retention characteristics indicating data retention characteristics are degraded as the phase-transition temperature is lowered, and are improved as the phase-transition temperature is increased. That is, by measuring the phase-transition temperature of the recording/reproducing film, the retention characteristics of the phase-change memory can be evaluated.

A SnTe/Sb$_2$Te$_3$ superlattice film is a recording/reproducing film of the Sn$_x$Te$_{100-x}$/Sb$_2$Te$_3$ superlattice phase-change memory described in Patent Document 2, and FIG. 7 indicates that the phase-transition temperature of the SnTe/Sb$_2$Te$_3$ superlattice film is 85 degrees Celsius. On the other hand, a GST225 film is a recording/reproducing film of an existing phase-change memory called GST225, and FIG. 7 indicates that the phase-transition temperature of the GST225 film is 145 degrees Celsius. Also, a GeTe/Sb$_2$Te$_3$ superlattice film is, for example, a recording/reproducing film of the GeTe(111)/Sb$_2$Te$_3$(001) superlattice phase-change memory described in Patent Document 1, and FIG. 7 indicates that the phase-transition temperature of the GeTe/Sb$_2$Te$_3$ superlattice film is 165 degrees Celsius. According to the foregoing, it can be found that the phase-transition temperature of the Sn$_x$Te$_{100-x}$/Sb$_2$Te$_3$ superlattice phase-change memory is considerably lower than the phase-transition temperature of GST225 and the phase-transition temperature of the GeTe(111)/Sb$_2$Te$_3$(001) superlattice phase-change memory. This means that the retention characteristics of the Sn$_x$Te$_{100-x}$/Sb$_2$Te$_3$ superlattice phase-change memory are degraded more than the retention characteristics of GST225 and the retention characteristics of the GeTe(111)/Sb$_2$Te$_3$(001) superlattice phase-change memory.

On the other hand, a Sn$_{25}$Ge$_{25}$Te$_{50}$/Sb$_2$Te$_3$ superlattice film is an example of the recording/reproducing film of the (SnGeSb)Te/Sb$_2$Te$_3$ superlattice phase-change memory in Example 1, and FIG. 7 indicates that the phase-transition temperature of the Sn$_{25}$Ge$_{25}$Te$_{50}$/Sb$_2$Te$_3$ superlattice film is 150 degrees Celsius. A Sn$_{45}$Ge$_5$Te$_{50}$/Sb$_2$Te$_3$ superlattice film is an example of the recording/reproducing film of the (SnGeSb)Te/Sb$_2$Te$_3$ superlattice phase-change memory in Example 1, and FIG. 7 indicates that the phase-transition temperature of the Sn$_{45}$Ge$_5$Te$_{50}$/Sb$_2$Te$_3$ superlattice film is also 150 degrees Celsius. Therefore, it can be found that, compared with the phase-transition temperature of the SnTe/Sb$_2$Te$_3$ superlattice film, the phase-transition temperature of the Sn$_{25}$Ge$_{25}$Te$_{50}$/Sb$_2$Te$_3$ superlattice film and the phase-transition temperature of the Sn$_{45}$Ge$_5$Te$_{50}$/Sb$_2$Te$_3$ superlattice film are high, and are equivalent to the phase-transition temperature of the GST225 film and the phase-transition temperature of the GeTe/Sb$_2$Te$_3$ superlattice film.

This means that, by introducing Ge, the retention characteristics of the (SnGeSb)Te/Sb$_2$Te$_3$ superlattice phase-change memory are significantly improved from the retention characteristics of the Sn$_x$Te$_{100-x}$/Sb$_2$Te$_3$ superlattice phase-change memory. Furthermore, this means that the retention characteristics of the (SnGeSb)Te/Sb$_2$Te$_3$ superlattice phase-change memory are equivalent to the retention characteristics of GST225 and the retention characteristics of the GeTe(111)/Sb$_2$Te$_3$(001) superlattice phase-change memory. Therefore, according to the (SnGeSb)Te/Sb$_2$Te$_3$ superlattice phase-change memory in Example 1, it can be found that the fact that the retention characteristics are improved to a level capable of withstanding practical use is quantitatively supported.

Meanwhile, FIG. 2 is a diagram illustrating a method of forming the recording/reproducing film MRF. The recording/reproducing film MRF is formed by alternately laminating the free layer FRL and the pinned layer FXL by using, for example, sputtering. The free layer FRL is configured of a (SnXSb)Te film. Here, in Example 1, the element X is Ge, and the free layer FRL is a (SnGeSb)Te film. The (SnGeSb)Te film in Example 1 is formed having a composition ratio of the atom % of Sn, Ge, and Sb in total to the atom % of Te as approximately 50% to 50%.

Here, Patent Document 2 (refer to FIG. 24 of Patent Document 2) discloses a crystalline structure of the NaCl-type SnSbTe alloy phase in the Sn$_x$Te$_{100-x}$/Sb$_2$Te$_3$ superlattice film when the atom % of Sn is 50 atom %. Therefore, on the analogy of Patent Document 2, as in Example 1, when a (SnXSb)Te film having a composition ratio of the atom % of Sn, Ge, and Sb in total to the atom % of Te being about 50% to 50% is used to form a (SnGeSb)Te/Sb$_2$Te$_3$ superlattice film, the formed (SnGeSb)Te alloy phase is predicted to be of an NaCl type. Actually, from FIG. 4 indicating the X-ray diffraction profile of the (SnGeSb)/$Sb_2Te_3$ superlattice film, it can be found that a NaCl-type (SnGeSb)Te alloy phase is formed. According to the crystallographic microstructure analysis described above, it is evident that the highest potential crystalline structure as the crystalline structure of the (SnGeSb)Te alloy phase is, for example, a NaCl-type crystalline structure having a vacancy layer as illustrated in FIG. 5, and the NaCl-type crystalline structure having the vacancy layer functions as a self-assembled superlattice structure. As a result, Ge used in Example 1 satisfies the first condition described above, and "Sn switching" in the self-assembled superlattice structure included in the (SnGeSb)Te alloy phase can be induced with low power. In this manner, the low power operation in the (SnGeSb)Te/$Sb_2Te_3$ superlattice phase-change memory can be achieved. Furthermore, from FIG. 6, Ge used in Example 1 also satisfies the second condition described above. In this manner, the retention characteristics of the (SnGeSb)Te/$Sb_2Te_3$ superlattice phase-change memory can be improved.

Furthermore, in Patent Document 2 (refer to FIG. 25 of Patent Document 2), when the atom % of Sn is lowered (5 atom %, 10 atom %, 20 atom %, and 35 atom %), the crystalline structure of the SnSbTe alloy phase in the $Sn_xTe_{100-x}$/$Sb_2Te_3$ superlattice film is not of the NaCl type but becomes an hcp (hexagonal closest packed)-type crystalline structure. Therefore, on the analogy of Patent Document 2, in Example 1, when a (SnXSb)Te film having a composition ratio where the atom % of Sn, Ge, and Sb in total is considerably lower than the atom % of Te is used to form a (SnGeSb)Te/$Sb_2Te_3$ superlattice film, the (SnGeSb)Te alloy phase formed is expected to have an hcp crystalline structure. Also in this case, on the analogy of Patent Document 2, it is considered that the highest potential crystalline structure as the crystalline structure of the (SnGeSb)Te alloy phase is, for example, an hcp-type crystalline structure having a vacancy layer, and the hcp-type crystalline structure having the vacancy layer functions as a self-assembled superlattice structure. Also in this case, as with Example 1, Ge satisfies the first condition described above, and "Sn switching" in the self-assembled superlattice structure included in the (SnGeSb)Te alloy phase can be induced with low power. In this manner, it can be considered that the low power operation in the (SnGeSb)Te/$Sb_2Te_3$ superlattice phase-change memory can be achieved. Furthermore, from FIG. 6, Ge also satisfies the second condition described above. In this manner, the retention characteristics of the (SnGeSb)Te/$Sb_2Te_3$ superlattice phase-change memory can be improved.

In particular, from the description of Patent Document 2, if a (SnGeSb)Te film having a composition ratio where the atom % of Sn, Ge, and Sb in total is considerably lower than the atom % of Te is used, it can be predicted that the low power operation of "Sn switching" is accelerated. Therefore, in view of achieving a sufficient low power operation while improving the retention characteristics of the (SnGeSb)Te/$Sb_2Te_3$ superlattice phase-change memory, it can be considered that a (SnGeSb)Te film having a composition ratio where the atom % of Sn, Ge, and Sb in total is considerably lower than the atom % of Te is preferably used to form a (SnGeSb)Te/$Sb_2Te_3$ superlattice film.

Furthermore, according to the mechanism described in Example 1, since the bonding between Ge and Te is strong, the wave function of the bonding between Ge and Te exudates to strengthen the chemical bonding strength among the atoms in the (Sn, Ge, Sb) layer, thereby improving the retention characteristics. In consideration of this, a (SnGeSb)Te film having a composition ratio where the atom % of Sn, Ge, and Sb in total is considerably lower than the atom % of Te is used, the atom % of Ge having a function of strengthening the chemical bonding strength among the atoms is increased within a range of solid solubility limitation. In this manner, it can be considered that a sufficient low power operation can be achieved while the retention characteristics are efficiently improved. The same goes for Example 2 to Example 4, which will be described below.

<Example 2: The Case of the Element X=Al Atom>

Figure 8:
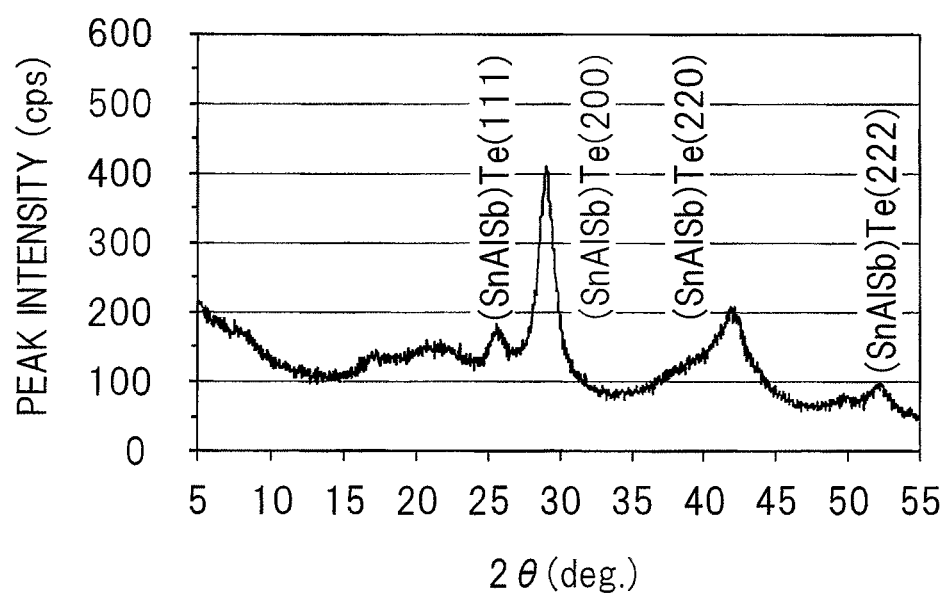
FIG. 8 is a diagram illustrating an X-ray diffraction profile of a (SnAlSb)/$Sb_2Te_3$ superlattice film when the element X is Al.

FIG. 8 is a diagram illustrating an X-ray diffraction profile of a (SnAlSb)/$Sb_2Te_3$ superlattice film when the element X is Al (aluminium). As illustrated in FIG. 8, only a peak of a NaCl-type (SnAlSb)Te alloy phase is observed. From this, it can be found that a (SnAlSb)/$Sb_2Te_3$ superlattice film is configured mostly of a (SnAlSb)Te alloy phase. Since any other phase is not observed in FIG. 8, it can be considered that Al has been solutionized in the (Sn, Sb) layer in the (SnAlSb)Te alloy phase.

Next, the results of crystallographic microstructure analysis of the NaCl-type (SnAlSb)Te alloy phase having the peak illustrated in FIG. 8 are described. For crystallographic microstructure analysis, for example, the method described in "J. Appl. Phys. 112, 034301 (2012)" is used. Specifically, in this crystallographic microstructure analysis, a search was made for a crystalline structure satisfying $(I_{111}/I_{222})_{Obs} \approx (I_{111}/I_{222})_{Cal}$ and $0.7 \leq S \leq 1$ ($\pm 0.1$). Here, $I_{111}$ indicates a (111)-peak integral intensity, and $I_{222}$ indicates a (222)-peak integral intensity. Also, $(I_{111}/I_{222})_{Obs}$ is an experimental integral peak intensity ratio, $(I_{111}/I_{222})_{Cal}$ is a theoretical integral peak intensity ratio, and "S" indicates a degree of order.

Figure 9:
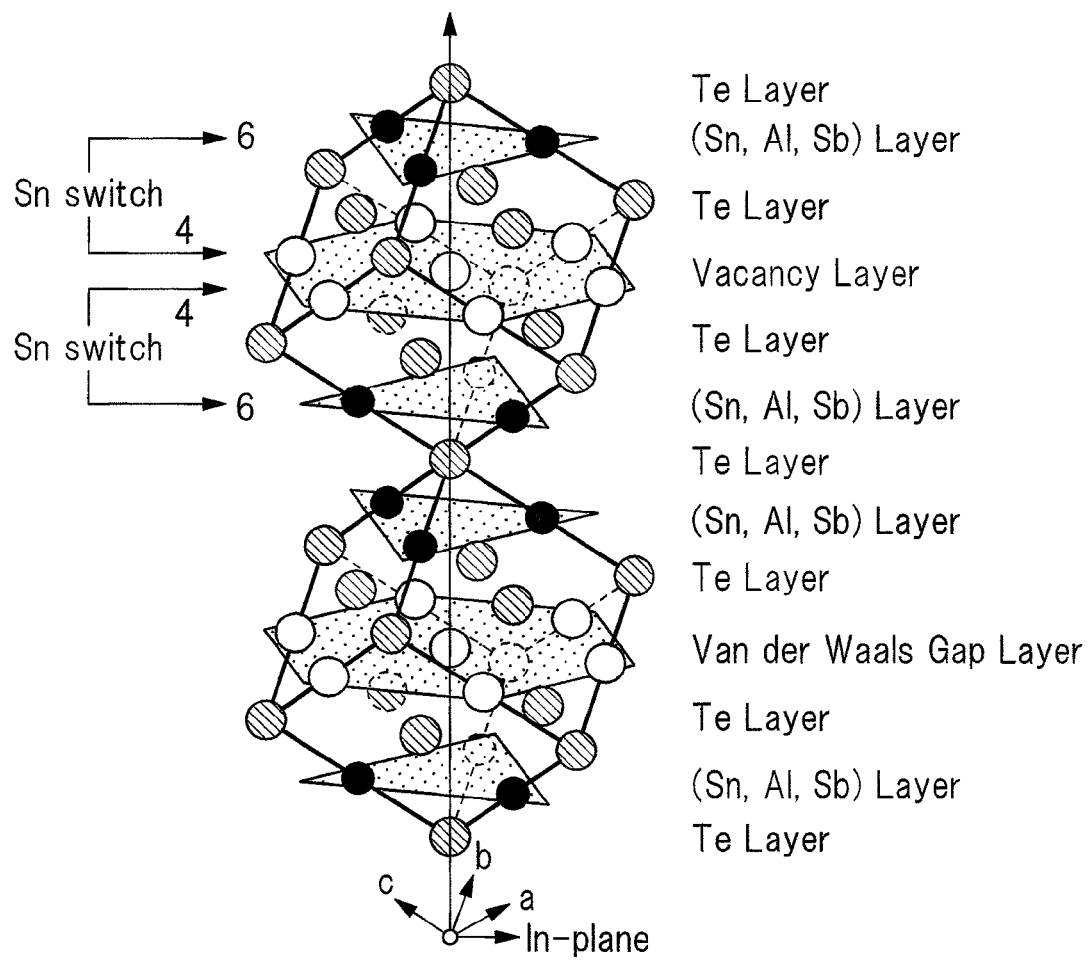
FIG. 9 is a diagram of a crystalline structure of a (SnAlSb)Te alloy phase.

As a result of this crystallographic microstructure analysis, it was found that the highest potential crystalline structure as the crystalline structure of a (SnAlSb)Te alloy phase is, for example, a NaCl-type crystalline structure having a vacancy layer as illustrated in FIG. 9. Specifically, the (SnAlSb)Te alloy phase is considered to have a crystalline structure formed by deposition of "—Te layer-(Sn, Al, Sb) layer-Te layer-Van der Waals gap layer-Te layer-(Sn, Al, Sb) layer-Te layer-(Sn, Al, Sb) layer-Te layer-vacancy layer-Te layer-(Sn, Al, Sb) layer-Te layer" in this order in (SnAlSb)Te[111] direction, as illustrated in FIG. 9.

In the crystalline structure of the (SnAlSb)Te alloy phase, there is a possibility that the deposition structure is changed, by using a space that is a vacancy layer, between the 6-fold bond state (As-dep. state) of Sn atoms in which the state is "—Te layer-(Sn, Al, Sb) layer-Te layer-vacancy layer-Te layer-(Sn, Al, Sb) layer-Te layer" and the 4-fold bond state of Sn atoms in which the state is "—Te layer-vacancy layer-Te layer-(Sn, Al, Sb) layer-Te layer-vacancy layer-Te layer", according to the applied voltage and the applied current. That is, there is a high possibility that "Sn switching" may occur where insertion and desorption of Sn is performed in the vacancy layer in the (SnAlSb)Te alloy phase.

Also, while the vacancy layer included in the upper side of the crystalline structure is an important space layer in "Sn switching", there is a high possibility that the space on the lower side of the crystalline structure is a Van der Waals gap layer, which is a space required for functioning as a buffer layer which absorbs a volume change in "Sn switching". That is, it can be found that there is a high possibility that the (SnAlSb)Te alloy phase includes a self-assembled superlattice structure.

According to the foregoing, by using the superlattice phase-change memory using the (SnAlSb)/$Sb_2Te_3$ superlattice film as the recording/reproducing film MRF, the (SnAlSb)/Sb$_2$Te$_3$ superlattice film is configured of the (SnAlSb)Te alloy phase having a self-assembled superlattice structure and the low-voltage operation is possible. That is, when the element X is Al, it can be considered that Al is placed in the (Sn, Sb) layer included in the self-assembled superlattice structure of the (SnAlSb)Te alloy phase to configure a (Sn, Al, Sb) layer, and thus Al satisfies the first condition described above.

As such, it can be found that Al added in Example 2 is an element at least satisfying the first condition in the (SnAlSb) Te/Sb$_2$Te$_3$ superlattice film, keeping the self-assembled superlattice structure without breaking it when added. In this manner, in the (SnAlSb)Te/Sb$_2$Te$_3$ superlattice film, with a mechanism equivalent to the low-voltage operation mechanism of the Sn$_x$Te$_{100-x}$/Sb$_2$Te$_3$ superlattice film, the low-voltage operation of the (SnAlSb)Te/Sb$_2$Te$_3$ superlattice phase-change memory using the (SnAlSb)Te/Sb$_2$Te$_3$ superlattice film as the recording/reproducing film MRF is possible. That is, also in the (SnAlSb)Te/Sb$_2$Te$_3$ superlattice film, "Sn switching" in the self-assembled superlattice structure included in the (SnAlSb)Te alloy phase can be induced with low power. In this manner, the low power operation in the (SnAlSb)Te/Sb$_2$Te$_3$ superlattice phase-change memory can be achieved.

Next, according to Al, the second condition mentioned above is also satisfied. In this manner, according to the superlattice phase-change memory using the (SnAlSb)Te/Sb$_2$Te$_3$ superlattice film as the recording/reproducing film MRF, the retention characteristics can be improved, which is described below.

Figure 10:
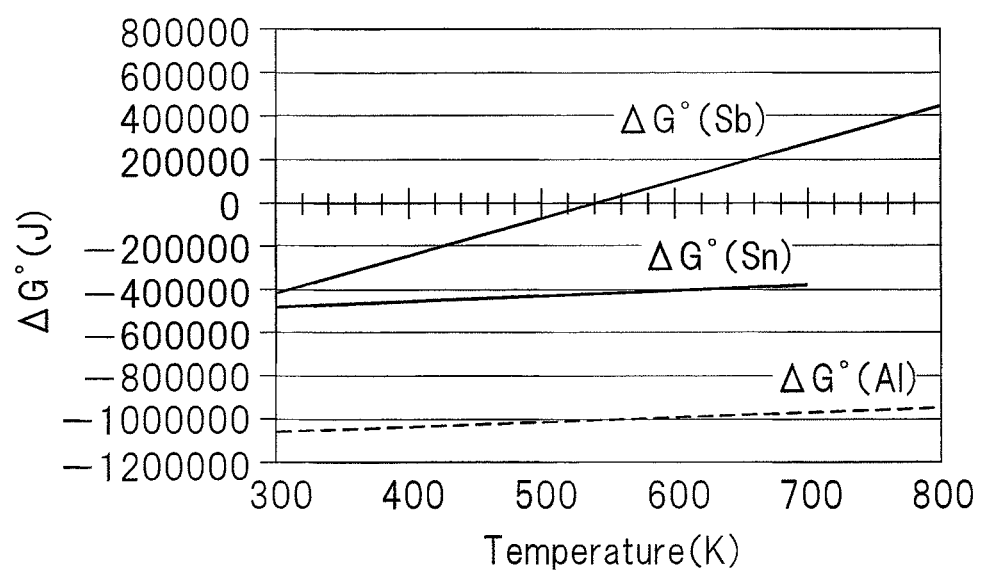
FIG. 10 is a graph illustrating temperature dependency of standard free energies of formation of a Sn oxide, a Sb oxide, and an Al oxide.

FIG. 10 is a graph illustrating temperature dependency of standard free energies of formation of a Sn oxide, a Sb oxide, and an Al oxide. As illustrated in FIG. 10, it can be found that, over a wide temperature range (300K to 800K), the absolute value of the standard free energy of formation $\Delta G°(Al)$ of the Al oxide is larger than the absolute value of the standard free energy of formation $\Delta G°(Sn)$ of the Sn oxide and the absolute value of the standard free energy of formation $\Delta G°(Sb)$ of the Sb oxide. This indirectly means that the bonding strength between Al and Te is stronger than the bonding strength between Sn and Te and the bonding strength between Sb and Te.

Therefore, Al introduced in Example 2 is an element satisfying the above-described first and second conditions. According to the Al-introduced (SnAlSb)Te/Sb$_2$Te$_3$ superlattice phase-change memory, the retention characteristics can be improved while a sufficient low power operation is kept, as compared with the existing GST225. The reason for this is as follows. In the (Sn, Al, Sb) layer of the self-assembled superlattice structure with Al introduced thereto, Al having a bonding strength with Te stronger than the bonding strength between Sn and Te and the bonding strength between Sb and Te, since the bonding between Al and Te is strong, a wave function of the bonding between Al and Te exudates to strengthen the chemical bonding strength among the atoms in the (Sn, Al, Sb) layer. In other words, the strong bonding between Al and Te means that an electron cloud extends, and the influence of the extending electron cloud strengthens the chemical bonding strength among the atoms in the (Sn, Al, Sb) layer. As a result, fluctuations of Sn atoms can be mitigated. In this manner, the retention characteristics of the (SnAlSb)Te/Sb$_2$Te$_3$ superlattice phase-change memory can be improved.

Specifically, a Sn$_{45}$Al$_5$Te$_{50}$/Sb$_2$Te$_3$ superlattice film is an example of the recording/reproducing film of the (SnAlSb) Te/Sb$_2$Te$_3$ superlattice phase-change memory in Example 2, and FIG. 7 indicates that the phase-transition temperature of the Sn$_{45}$Al$_5$Te$_{50}$/Sb$_2$Te$_3$ superlattice film is 145 degrees Celsius. Therefore, it can be found that, as compared with the phase-transition temperature of the SnTe/Sb$_2$Te$_3$ superlattice film, the phase-transition temperature of the Sn$_{45}$Al$_5$Te$_{50}$/Sb$_2$Te$_3$ superlattice film is high, and is equivalent to the phase-transition temperature of the GST225 film and the phase-transition temperature of the GeTe/Sb$_2$Te$_3$ superlattice film.

This means that, by introducing Al, the retention characteristics of the (SnAlSb)Te/Sb$_2$Te$_3$ superlattice phase-change memory are significantly improved from the retention characteristics of the Sn$_x$Te$_{100-x}$/Sb$_2$Te$_3$ superlattice phase-change memory. Furthermore, this means that the retention characteristics of the (SnAlSb)Te/Sb$_2$Te$_3$ superlattice phase-change memory are equivalent to the retention characteristics of GST225 and the retention characteristics of the GeTe(111)/Sb$_2$Te$_3$(001) superlattice phase-change memory. Therefore, according to the (SnAlSb)Te/Sb$_2$Te$_3$ superlattice phase-change memory in Example 2, it can be found that the fact that the retention characteristics are improved to a level capable of withstanding practical use is quantitatively supported.

<Example 3: The Case of the Element X=Mn Atom or Cr Atom>

In Example 3, an example is described in which Mn (Manganese) atoms and Cr (chrome) atoms are used as the element X. Mn and Cr are thought to have a characteristic of being solutionized in a telluride. From this, it can be considered that Mn and Cr are solutionized in the (Sn, Sb) layer of the self-assembled superlattice structure to form a (Sn, Mn, Sb) layer and a (Sn, Cr, Sb) layer without breaking the self-assembled superlattice structure.

Figure 11:
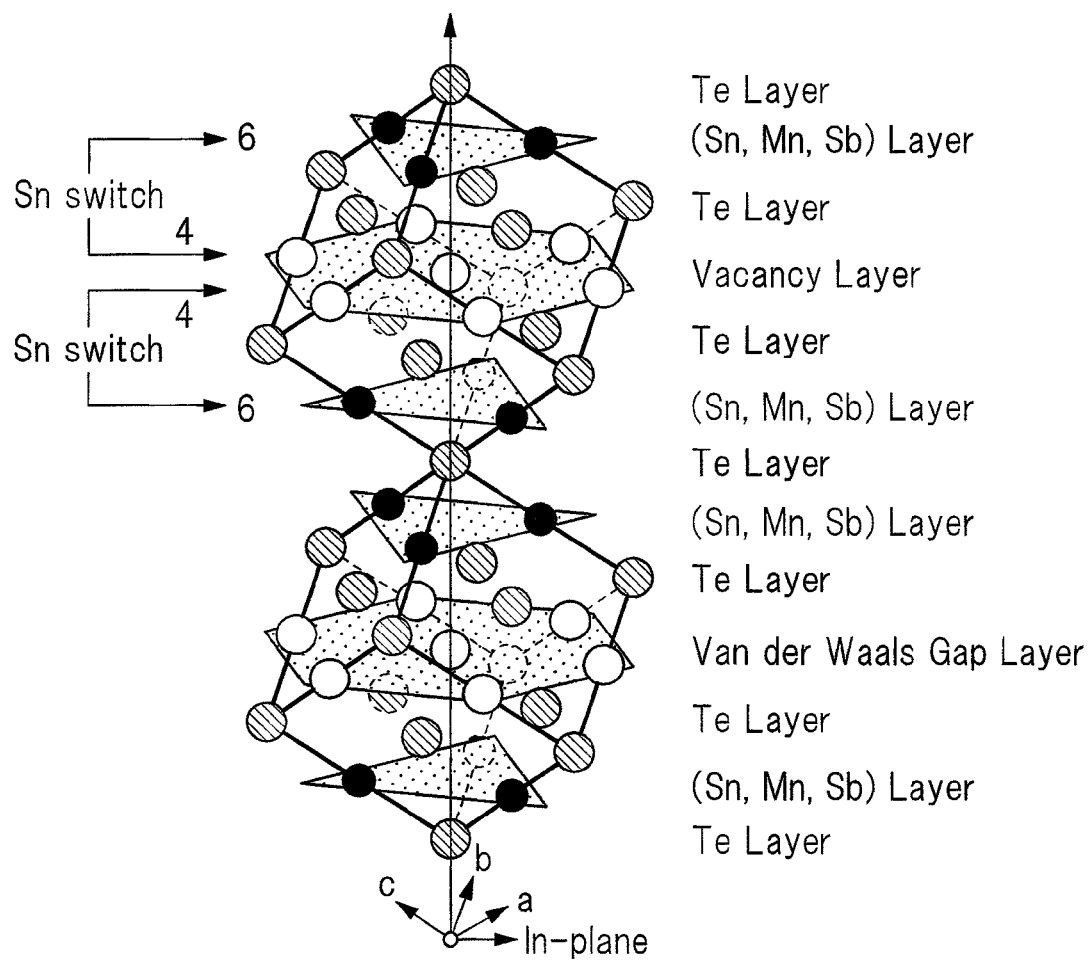
FIG. 11 is a diagram illustrating a crystalline structure of a (SnMnSb)Te alloy phase.

Therefore, also when the element X is a Mn atom and a Cr atom, it can be considered that there is a high possibility that the crystalline structure is similar to those of the Ge atom described in Example 1 and the Al atom described in Example 2. That is, as illustrated in FIG. 11, a (SnMnSb)Te alloy phase is considered to have a crystalline structure formed by deposition of "—Te layer-(Sn, Mn, Sb) layer-Te layer-Van der Waals gap layer-Te layer-(Sn, Mn, Sb) layer-Te layer-(Sn, Mn, Sb) layer-Te layer-vacancy layer-Te layer-(Sn, Mn, Sb) layer-Te layer" in this order in (SnMnSb)Te [111] direction.

In the crystalline structure of the (SnMnSb)Te alloy phase, there is a possibility that the deposition structure is changed, by using a space called a vacancy layer, between the 6-fold bond state (As-dep. state) of Sn atoms in which the state is "—Te layer-(Sn, Mn, Sb) layer-Te layer-vacancy layer-Te layer-(Sn, Mn, Sb) layer-Te layer" and the 4-fold bond state of Sn atoms in which the state is "—Te layer-vacancy layer-Te layer-(Sn, Mn, Sb) layer-Te layer-vacancy layer-Te layer", according to the applied voltage and the applied current. That is, there is a high possibility that "Sn switching" may occur where insertion and desorption of Sn is performed in the vacancy layer in the (SnMnSb)Te alloy phase.

Also, while the vacancy layer included in the upper side of the crystalline structure is an important space layer in "Sn switching", there is a high possibility that the space on the lower side of the crystalline structure is a Van der Waals gap layer, which is a space required for functioning as a buffer layer which absorbs a volume change in "Sn switching". That is, it can be found that there is a high possibility that the (SnMnSb)Te alloy phase includes a self-assembled superlattice structure.

According to the foregoing, by using the superlattice phase-change memory using the (SnMnSb)/Sb$_2$Te$_3$ superlattice film as the recording/reproducing film MRF, the (SnMnSb)/Sb$_2$Te$_3$ superlattice film is configured of the (SnMnSb)Te alloy phase having a self-assembled superlattice structure and the low-voltage operation is possible. That is, when the element X is Mn, it can be considered that Mn is placed in the (Sn, Sb) layer included in the self-assembled superlattice structure of the (SnMnSb)Te alloy phase to configure a (Sn, Mn, Sb) layer, and thereby Mn satisfies the first condition described above.

As such, it can be found that Mn added in Example 3 is an element at least satisfying the first condition in the (SnMnSb)Te/Sb$_2$Te$_3$ superlattice film, keeping the self-assembled superlattice structure without breaking it when added. In this manner, in the (SnMnSb)Te/Sb$_2$Te$_3$ superlattice film, with a mechanism equivalent to the low-voltage operation mechanism of the Sn$_x$Te$_{100-x}$/Sb$_2$Te$_3$ superlattice film, the low-voltage operation of the (SnMnSb)Te/Sb$_2$Te$_3$ superlattice phase-change memory using the (SnMnSb)Te/Sb$_2$Te$_3$ superlattice film as the recording/reproducing film MRF is possible. That is, also in the (SnMnSb)Te/Sb$_2$Te$_3$ superlattice film, "Sn switching" in the self-assembled superlattice structure included in the (SnMnSb)Te alloy phase can be induced with low power. In this manner, the low power operation in the (SnMnSb)Te/Sb$_2$Te$_3$ superlattice phase-change memory can be achieved.

Next, according to Mn, the second condition mentioned above is also satisfied. Accordingly, capability of improving the retention characteristics by using the superlattice phase-change memory using the (SnMnSb)Te/Sb$_2$Te$_3$ superlattice film as the recording/reproducing film MRF will be described below.

Figure 13:
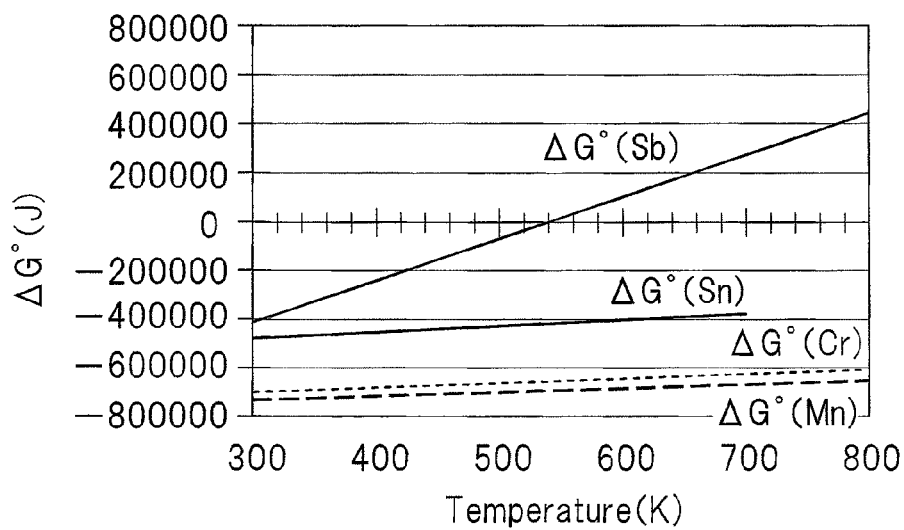
FIG. 13 is a graph illustrating temperature dependency of standard free energies of formation of a Sn oxide, and Sb oxide, a Mn oxide, and a Cr oxide.

FIG. 13 is a graph illustrating temperature dependency of standard free energies of formation of a Sn oxide, a Sb oxide, and a Mn oxide. As illustrated in FIG. 13, it can be found that, over a wide temperature range (300K to 800K), the absolute value of the standard free energy of formation $\Delta G°(Mn)$ of the Mn oxide is larger than the absolute value of the standard free energy of formation $\Delta G°(Sn)$ of the Sn oxide and the absolute value of the standard free energy of formation $\Delta G°(Sb)$ of the Sb oxide. This indirectly means that the bonding strength between Mn and Te is stronger than the bonding strength between Sn and Te and the bonding strength between Sb and Te.

Therefore, Mn introduced in Example 3 is an element satisfying the above-described first and second conditions. According to the Mn-introduced (SnMnSb)Te/Sb$_2$Te$_3$ superlattice phase-change memory, the retention characteristics can be improved while a sufficient low power operation is kept, as compared with the existing GST225. The reason for this is as follows. In the (Sn, Mn, Sb) layer of the self-assembled superlattice structure with Mn introduced thereto, Mn having a bonding strength with Te stronger than the bonding strength between Sn and Te and the bonding strength between Sb and Te, since the bonding between Mn and Te is strong, a wave function of the bonding between Mn and Te exudates to strengthen the chemical bonding strength among the atoms in the (Sn, Mn, Sb) layer. In other words, the strong bonding between Mn and Te means that an electron cloud extends, and the influence of the extending electron cloud strengthens the chemical bonding strength among the atoms in the (Sn, Mn, Sb) layer. As a result, fluctuations of Sn atoms can be mitigated. In this manner, the retention characteristics of the (SnMnSb)Te/Sb$_2$Te$_3$ superlattice phase-change memory can be improved.

Figure 12:
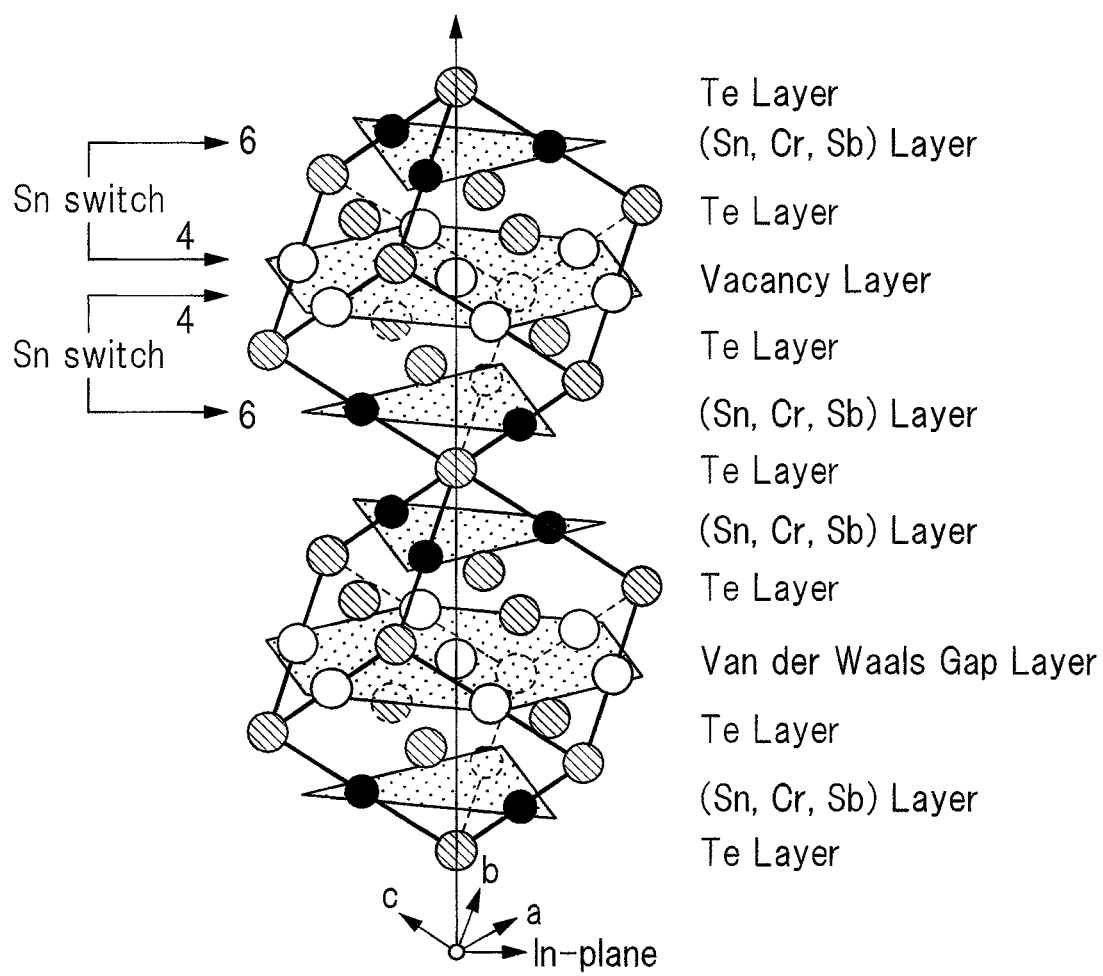
FIG. 12 is a diagram illustrating a crystalline structure of a (SnCrSb)Te alloy phase.

Similarly, the (SnCrSb)Te alloy phase is considered to have a crystalline structure with deposition of "—Te layer-(Sn, Cr, Sb) layer-Te layer-Van der Waals gap layer-Te layer-(Sn, Cr, Sb) layer-Te layer-(Sn, Cr, Sb) layer-Te layer-vacancy layer-Te layer-(Sn, Cr, Sb) layer-Te layer" in this order in (SnCrSb)Te[111] direction, as illustrated in FIG. 12.

In the crystalline structure of the (SnCrSb)Te alloy phase, there is a possibility that the deposition structure is changed, by using a space called a vacancy layer, between the 6-fold bond state (As-dep. state) of Sn atoms in which the state is "—Te layer-(Sn, Cr, Sb) layer-Te layer-vacancy layer-Te layer-(Sn, Cr, Sb) layer-Te layer" and the 4-fold bond state of Sn atoms in which the state is "—Te layer-vacancy layer-Te layer-(Sn, Cr, Sb) layer-Te layer-vacancy layer-Te layer", according to the applied voltage and the applied current. That is, there is a high possibility that "Sn switching" may occur where insertion and desorption of Sn is performed in the vacancy layer in the (SnCrSb)Te alloy phase.

Also, while the vacancy layer included in the upper side of the crystalline structure is an important space layer in "Sn switching", there is a high possibility that the space on the lower side of the crystalline structure is a Van der Waals gap layer, which is a space required for functioning as a buffer layer which absorbs a volume change in "Sn switching". That is, it can be found that there is a high possibility that the (SnCrSb)Te alloy phase includes a self-assembled superlattice structure.

According to the foregoing, by using the superlattice phase-change memory using the (SnCrSb)/Sb$_2$Te$_3$ superlattice film as the recording/reproducing film MRF, the (SnCrSb)/Sb$_2$Te$_3$ superlattice film is configured of the (SnCrSb)Te alloy phase having a self-assembled superlattice structure and the low-voltage operation is possible. That is, when the element X is Cr, it can be considered that Cr is placed in the (Sn, Sb) layer included in the self-assembled superlattice structure of the (SnCrSb)Te alloy phase to configure a (Sn, Cr, Sb) layer, and thus Cr satisfies the first condition described above.

As such, it can be found that Cr added in Example 3 is an element at least satisfying the first condition in the (SnCrSb)Te/Sb$_2$Te$_3$ superlattice film, keeping the self-assembled superlattice structure without breaking it when added. In this manner, in the (SnCrSb)Te/Sb$_2$Te$_3$ superlattice film, with a mechanism equivalent to the low-voltage operation mechanism of the Sn$_x$Te$_{100-x}$/Sb$_2$Te$_3$ superlattice film, the low-voltage operation of the (SnCrSb)Te/Sb$_2$Te$_3$ superlattice phase-change memory using the (SnCrSb)Te/Sb$_2$Te$_3$ superlattice film as the recording/reproducing film MRF is possible. That is, also in the (SnCrSb)Te/Sb$_2$Te$_3$ superlattice film, "Sn switching" in the self-assembled superlattice structure included in the (SnCrSb)Te alloy phase can be induced with low power. In this manner, the low power operation in the (SnCrSb)Te/Sb$_2$Te$_3$ superlattice phase-change memory can be achieved.

Next, according to Cr, the second condition mentioned above is also satisfied. In this manner, capability of improving the retention characteristics of the superlattice phase-change memory by using the (SnCrSb)Te/Sb$_2$Te$_3$ superlattice film as the recording/reproducing film MRF will be described below.

FIG. 13 is a graph illustrating temperature dependency of standard free energies of formation of a Sn oxide, a Sb oxide, and a Cr oxide. As illustrated in FIG. 13, it can be found that, over a wide temperature range (300K to 800K), the absolute value of the standard free energy of formation $\Delta G°(Cr)$ of the Cr oxide is larger than the absolute value of the standard free energy of formation $\Delta G°(Sn)$ of the Sn oxide and the absolute value of the standard free energy of formation $\Delta G°(Sb)$ of the Sb oxide. This indirectly means that the bonding strength between Cr and Te is stronger than the bonding strength between Sn and Te and the bonding strength between Sb and Te.

Therefore, Cr introduced in Example 3 is an element satisfying the above-described first and second conditions. According to the Cr-introduced (SnCrSb)Te/$Sb_2Te_3$ superlattice phase-change memory, the retention characteristics can be improved while a sufficient low power operation is kept, as compared with the existing GST225. The reason for this is as follows. In the (Sn, Cr, Sb) layer of the self-assembled superlattice structure with Cr introduced thereto, Cr having a bonding strength with Te stronger than the bonding strength between Sn and Te and the bonding strength between Sb and Te, since the bonding between Cr and Te is strong, a wave function of the bonding between Cr and Te exudates to strengthen the chemical bonding strength among the atoms in the (Sn, Cr, Sb) layer. In other words, the strong bonding between Cr and Te means that an electron cloud extends, and the influence of the extending electron cloud strengthens the chemical bonding strength among the atoms in the (Sn, Cr, Sb) layer. As a result, fluctuations of Sn atoms can be mitigated. In this manner, the retention characteristics of the (SnCrSb)Te/$Sb_2Te_3$ superlattice phase-change memory can be improved.

<Example 4: The Case of the Element X=Mo Atom, Nb Atom, V Atom, or Si Atom>

In Example 4, an example is described in which Mo (molybdenum) atoms, Nb (niobium) atoms, V (vanadium) atoms or Si (silicon) atoms are used as the element X. Mo, Nb, V, and Si are thought to have a characteristic of being solutionized in a telluride. From this, it can be considered that Mo, Nb, V, and Si are solutionized in the (Sn, Sb) layer of the self-assembled superlattice structure to form a (Sn, Mo, Sb) layer, a (Sn, Nb, Sb) layer, a (Sn, V, Sb) layer, and a (Sn, Si, Sb) layer without breaking the self-assembled superlattice structure. Therefore, when the element X is a Mo atom, a Nb atom, a V atom, or a Si atom, it can be considered that there is a high possibility that the crystalline structure is similar to those of the Ge atom described in Example 1, the Al atom described in Example 2, and the Mn atom and the Cr atom described in Example 3. Therefore, it can be considered that the first condition described above is satisfied.

Next, according to Mo, Nb, V, and Si, the second condition mentioned above is also satisfied. In this manner, capability of improving the retention characteristics according to the superlattice phase-change memory using the (SnXSb)Te/$Sb_2Te_3$ superlattice film (X=Mo, Nb, V, or Si) as the recording/reproducing film MRF will be described below.

Figure 14:
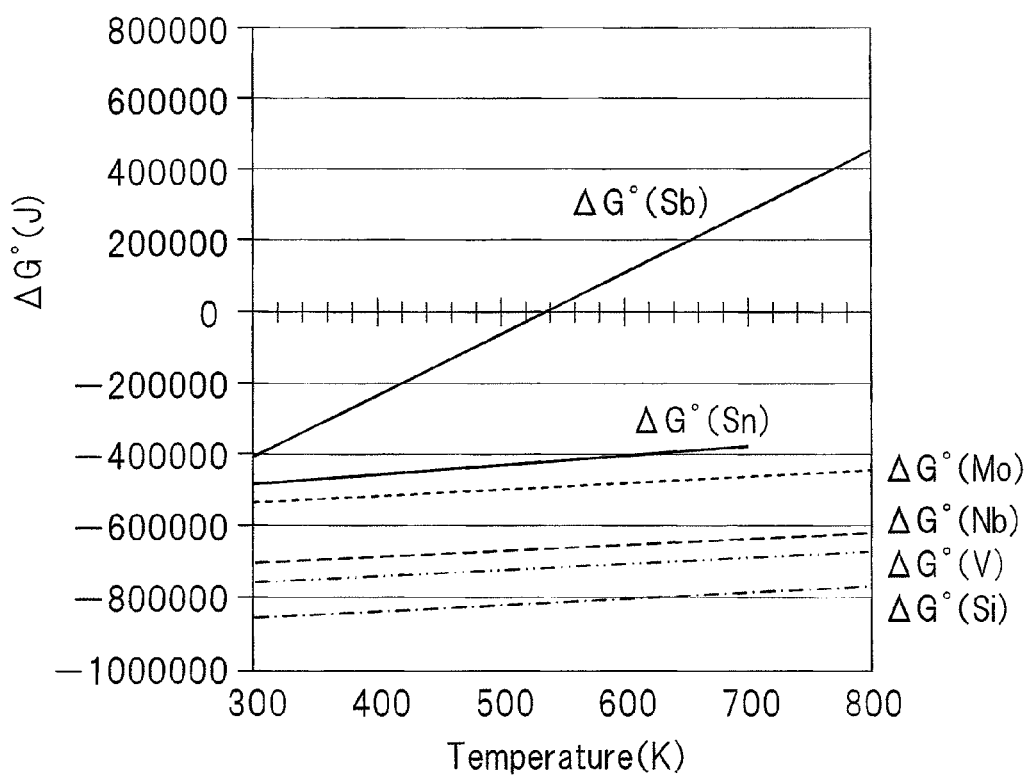
FIG. 14 is a graph illustrating temperature dependency of standard free energies of formation of a Sn oxide, an Sb oxide, a Mo oxide, a Nb oxide, a V oxide, and a Si oxide.

FIG. 14 is a graph illustrating temperature dependency of standard free energies of formation of a Sn oxide, a Sb oxide, a Mo oxide, a Nb oxide, a V oxide, and a Si oxide. As illustrated in FIG. 14, it can be found that, over a wide temperature range (300K to 800K), the absolute value of the standard free energy of formation $\Delta G°(Mo)$ of the Mo oxide is larger than the absolute value of the standard free energy of formation $\Delta G°(Sn)$ of the Sn oxide and the absolute value of the standard free energy of formation $\Delta G°(Sb)$ of the Sb oxide. This indirectly means that the bonding strength between Mo and Te is stronger than the bonding strength between Sn and Te and the bonding strength between Sb and Te. Similarly, it can be found that the absolute value of the standard free energy of formation $\Delta G°(Nb)$ of the Nb oxide, the absolute value of the standard free energy of formation $\Delta G°(V)$ of the V oxide, and the absolute value of the standard free energy of formation $\Delta G°(Si)$ of the Si oxide are larger than the absolute value of the standard free energy of formation $\Delta G°(Sn)$ of the Sn oxide and the absolute value of the standard free energy of formation $\Delta G°(Sb)$ of the Sb oxide. This indirectly means that the bonding strength between Mo and Te, the bonding strength between Nb and Te, the bonding strength between V and Te, and the bonding strength between Si and Te are stronger than the bonding strength between Sn and Te and the bonding strength between Sb and Te.

Therefore, X (X=Mo, Nb, V, or Si) introduced in Example 4 is an element satisfying the above-described first and second conditions. According to the element X-introduced (SnXSb)Te/$Sb_2Te_3$ superlattice phase-change memory, the retention characteristics can be improved while a sufficient low power operation is kept, as compared with the existing GST225. The reason for this is as follows. In the (Sn, X, Sb) layer of the self-assembled superlattice structure with the element X introduced thereto, the element X having a bonding strength with Te stronger than the bonding strength between Sn and Te and the bonding strength between Sb and Te, since the bonding between the element X and Te is strong, a wave function of the bonding between the element X and Te exudates to strengthen the chemical bonding strength among the atoms in the (Sn, X, Sb) layer. In other words, the strong bonding between the element X and Te means that an electron cloud extends, and the influence of the extending electron cloud strengthens the chemical bonding strength among the atoms in the (Sn, X, Sb) layer. As a result, fluctuations of Sn atoms can be mitigated. In this manner, the retention characteristics of the (SnXSb)Te/$Sb_2Te_3$ superlattice phase-change memory can be improved.

(Second Embodiment)

In a second embodiment, a semiconductor recording/reproducing device using the phase-change memory in the first embodiment is described.

<Structure of Memory Cell>

Figure 15:
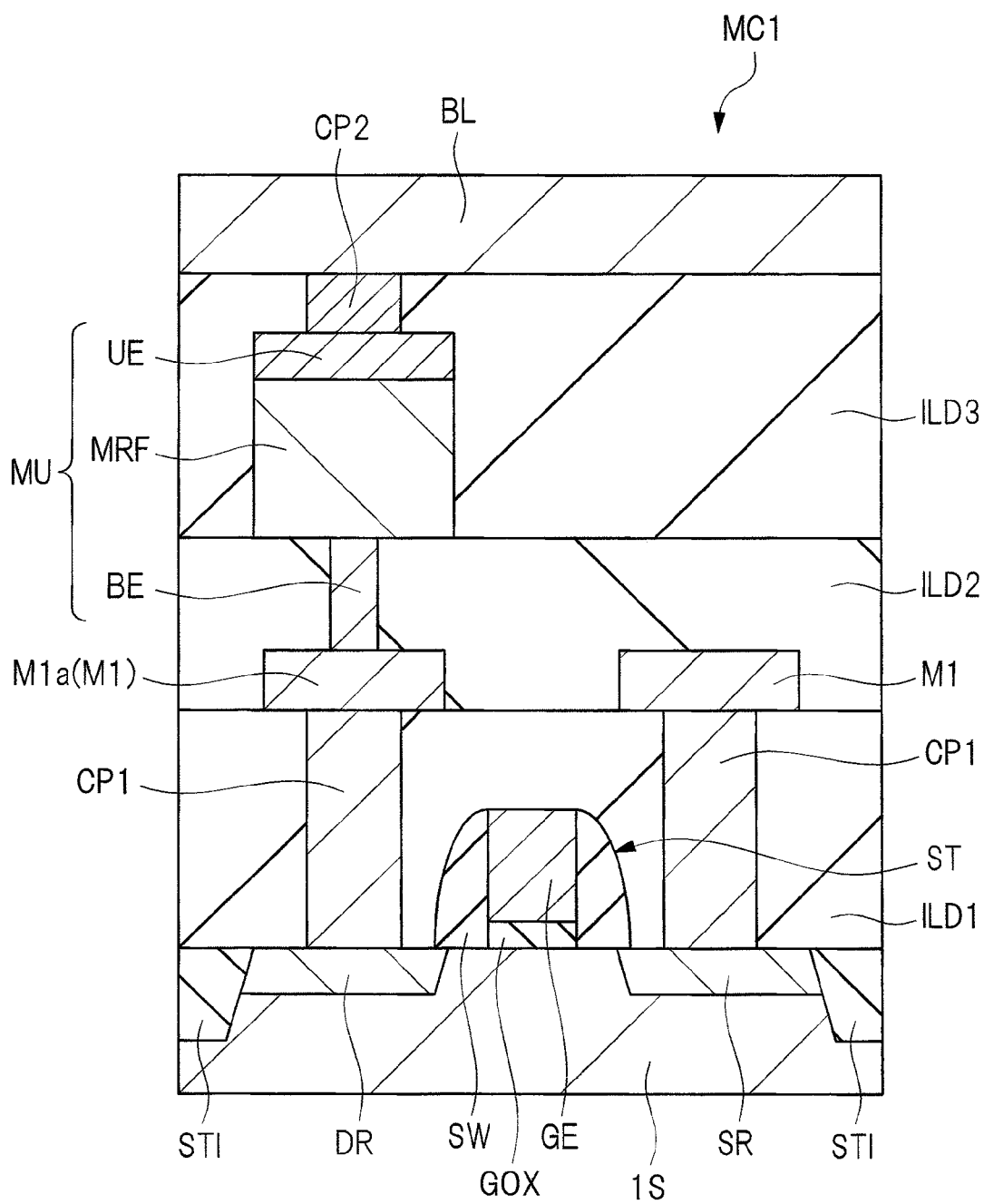
FIG. 15 is a cross-sectional view of a structure of a memory cell of a semiconductor recording/reproducing device according to a second embodiment.

FIG. 15 is a cross-sectional view of the structure of a memory cell of the semiconductor recording/reproducing device in the second embodiment. In FIG. 15, a memory cell MC1 in the second embodiment is formed on a main surface of a semiconductor substrate 1S made of, for example, single-crystal silicon, and includes a field effect transistor, which is a selection transistor St which selects the memory cell MC1 and a memory unit MU formed above the selection transistor ST. In the memory cell MC1, along with a change in atom arrangement or atom position of the recording/reproducing film included in the memory unit, the electrical resistance of the recording/reproducing film MRF is changed between a low-resistance state and a high-resistance state to record information.

In the following description, the state in which resistance of the recording/reproducing film MRF is relatively low (low-resistance state) is referred to as a "set state", and the state in which resistance of the recording/reproducing film MRF is relatively high (high-resistance state) is referred to as a "reset state". Also, the operation of changing the recording/reproducing film MRF from the high-resistance state to the low-resistance state is referred to as a "set operation", and the operation of changing the recording/reproducing film MRF from the low-resistance state to the high-resistance state is referred to as a "reset operation".

While an example of using the semiconductor substrate 1S is described in the second embodiment, any of various substrates, such as a glass substrate, having a semiconductor layer formed thereon can be used in place of the semiconductor substrate 1S.

A specific structure of the memory cell MC1 in the second embodiment will be described below. As illustrated in FIG. 15, a gate electrode GE is formed on the main surface of the semiconductor substrate 1S via a gate insulator GOX, and a drain region DR and a source region SR are formed in the semiconductor substrate 1S across the gate electrode GE. The drain region DR, the source region SR, and the gate electrode GE form a selection transistor ST formed of the field effect transistor. Side wall spacers SW are formed on both side walls of the gate electrode GE, and these side wall spacers SW also configure part of the selection transistor.

Although not illustrated in FIG. 15, the gate electrode GE is electrically connected to a word line made of, for example, tungsten (W), and the drain region DR is electrically connected to a bit line BL via a wire M1a (M1) and the memory unit MU, as will be described below.

On the main surface of the semiconductor substrate 1S, a device isolation region STI is formed in contact with the drain region DR or the source region SR. On the semiconductor substrate 1S, an interlayer insulator ILD1 is formed of, for example, a silicon oxide film, so as to cover the gate electrode GE and the device isolation region STI.

On the interlayer insulator ILD1, a wire M1 is formed of, for example, a metal film. The wire M1 is electrically connected to the drain region DR or the source region SR via a contact plug CP1 formed to penetrate through the interlayer insulator ILD1. The contact plug CP1 is formed of, for example, a tungsten film.

On the interlayer insulator ILD1, an interlayer insulator ILD2 is formed of, for example, a silicon oxide film, so as to cover the wire M1. In the interlayer insulator ILD2, the lower electrode BE is formed on an upper portion of the wire M1a electrically connected to the drain region DR so as to penetrate through the interlayer insulator ILD2. The lower electrode BE is electrically connected to the wire M1a.

The recording/reproducing film MRF is formed on the interlayer insulator ILD2. As the recording/reproducing film MRF, for example, the (SnXSb)Te/Sb$_2$Te$_3$ superlattice film described in Example 1 to Example 4 is used. The recording/reproducing film MRF is electrically connected to the lower electrode BE. That is, the recording/reproducing film MRF is electrically connected to the drain region DR via the lower electrode BE, the wire M1a, and the contact plug CP1. Also, the upper electrode UE is formed on the recording/reproducing film MRF, and the upper electrode UE is electrically connected to the recording/reproducing film MRF. The above-described lower electrode BE, recording/reproducing film MRF, and upper electrode UE form the memory unit MU, and the memory unit MU is electrically connected to the selection transistor ST.

On the interlayer insulator ILD2, an interlayer insulator ILD3 is formed of, for example, a silicon oxide film, so as to cover the recording/reproducing film MRF and the upper electrode UE. In this interlayer insulator ILD3, a contact plug CP2 is formed of, for example, tungsten, on an upper portion of the upper electrode UE so as to penetrate through the interlayer insulator ILD3. This contact plug CP2 is electrically connected to the upper electrode UE.

On the interlayer insulator ILD3, a bit line BL is formed of, for example, tungsten. This bit line BL is electrically connected to the contact plug CP2. That is, the recording/reproducing film MRF is electrically connected to the bit line BL via the upper electrode UE and the contact plug CP2. Therefore, the drain region DR of the selection transistor ST is electrically connected to the bit line BL via the contact plug CP1, the wire M1a, the lower electrode BE, the recording/reproducing film MRF, the upper electrode UE, and the contact plug CP2. The bit line BL is further electrically connected to another circuit.

FIG. 15 illustrates an example of the cross-sectional view of one memory cell MC1 along a direction in which the bit line BL extends. In practice, however, a plurality of memory cells each having a structure similar to that of the memory cell MC1 described above are placed in an array in a plan view.

<Structure of Memory Cell Array>

Figure 16:
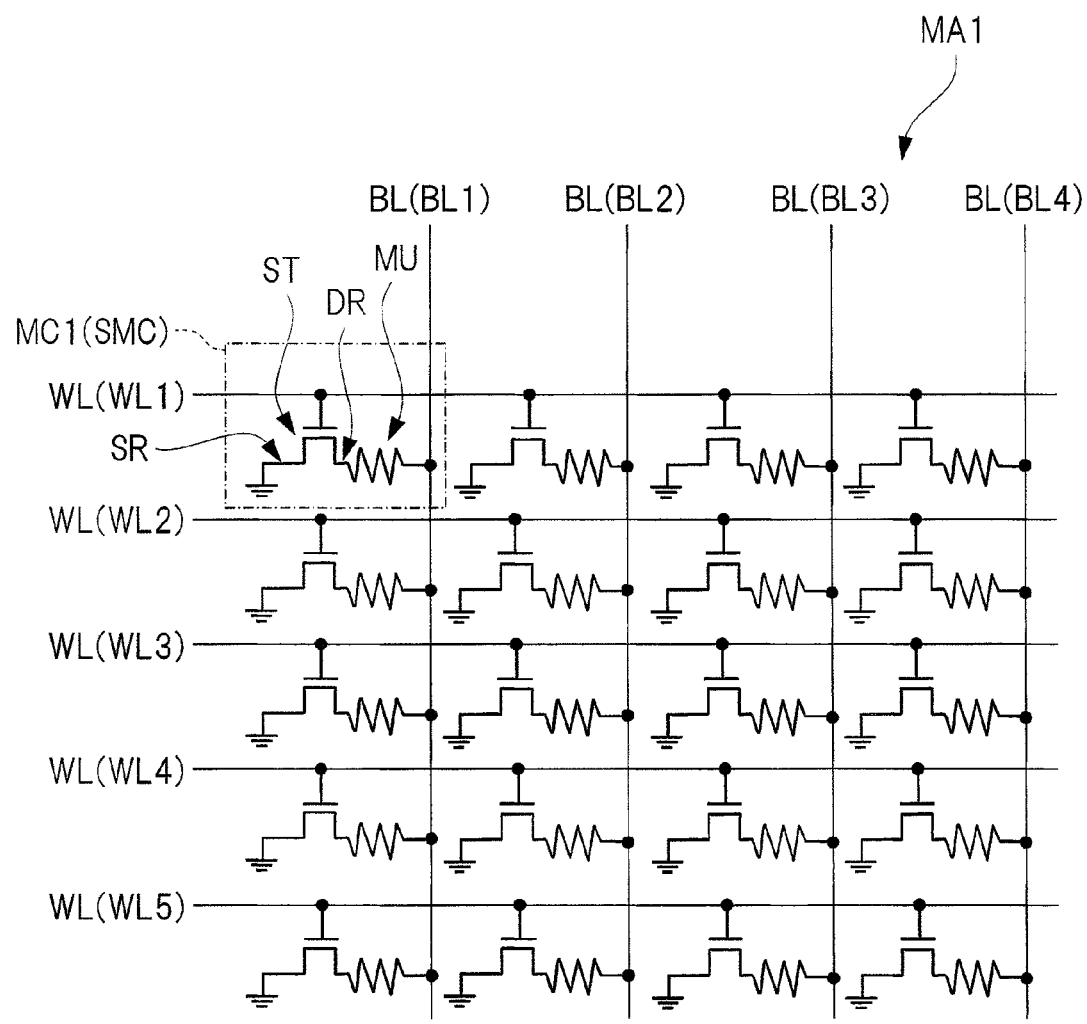
FIG. 16 is an equivalent circuit diagram illustrating an example of structure of a memory cell array of the semiconductor recording/reproducing device according to the second embodiment.

Next, an example of structure of the memory array of the semiconductor recording/reproducing device in the second embodiment is described. FIG. 16 is an equivalent circuit diagram illustrating an example of structure of a memory cell array MA1 of the semiconductor recording/reproducing device in the second embodiment.

As illustrated in FIG. 16, the semiconductor recording/reproducing device in the second embodiment includes a plurality of word lines WL (WL1 to WL5) extending in a first direction, a plurality of bit lines BL (BL1 to BL4) extending in a second direction crossing the first direction, and a memory cell array MA1 including a plurality of memory cells MC1 placed in a region where each word line WL and each bit line BL cross. Each of the plurality of memory cells MC1 includes the selection transistor ST and the memory unit MU including a recording/reproducing film. The drain region DR of the selection transistor ST is electrically connected to the bit line BL via the memory unit MU. Also, the source region SR of the selection transistor ST is grounded at a reference potential (GND potential), for example.

In FIG. 16, the memory unit MU including the recording/reproducing film is displayed as an electrical resistance. Also in FIG. 16, for simplification, only one of the plurality of memory cells MC1 disposed in the region where each word line WL and each bit line BL cross is provided with reference characters.

<Operation of Memory Cell Array>

The memory cell array MA1 in the second embodiment is configured as described above, and its operation is described below. Specifically, the memory cell array MA1 operates as follows.

Figure 17A:
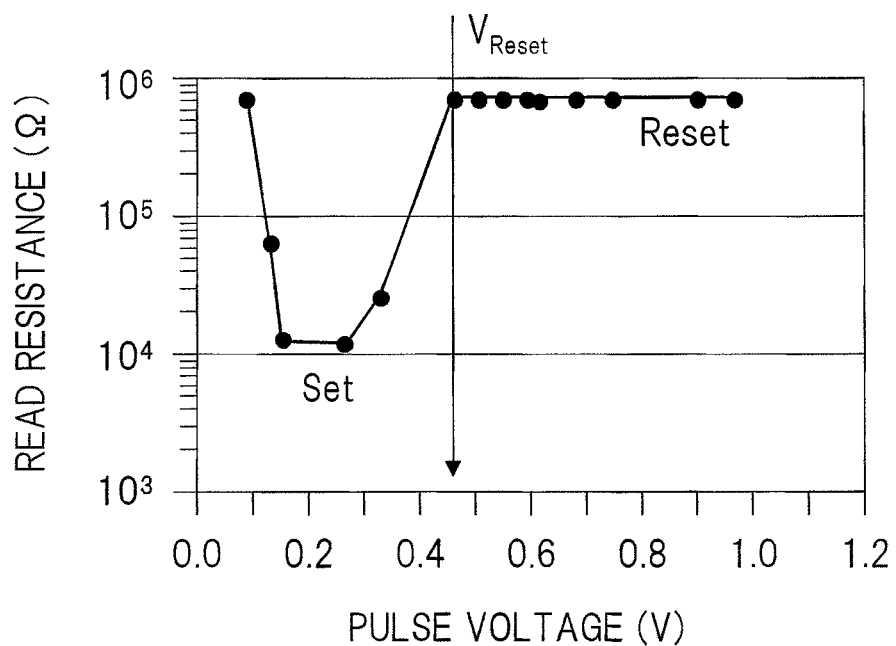
FIG. 17A is a graph illustrating pulse voltage dependency of read resistance of a simple element imitating a (SnGeSb)Te/$Sb_2Te_3$ superlattice phase-change memory.
Figure 17B:
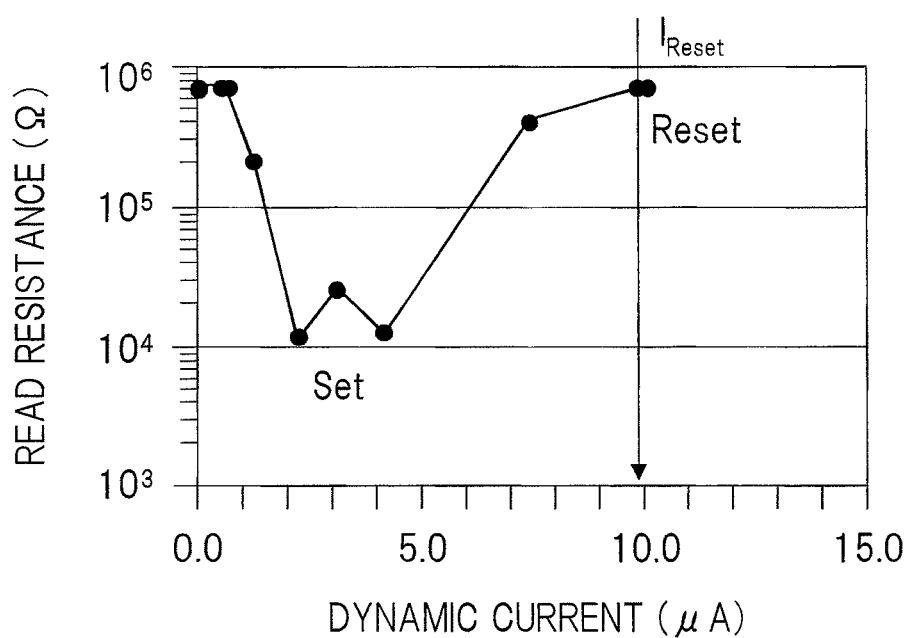
FIG. 17B is a graph illustrating dynamic current dependency of read resistance.

By way of example, the case is described in which the (SnGeSb)Te/Sb$_2$Te$_3$ superlattice film when X is a Ge atom as described in Example 1 is used as the recording/reproducing film. FIG. 17A is a graph illustrating pulse voltage dependency of read resistance of a simple element imitating the (SnGeSb)Te/Sb$_2$Te$_3$ superlattice phase-change memory. FIG. 17B is a graph illustrating dynamic current dependency of read resistance. Here, the set voltage was, for example, about 0.20 V, and the reset voltage was, for example, about 0.46 V. Also, the set current was, for example, about 4 μA, and the reset current was, for example, about 10 μA. Description is made to the case in which this simple element is used as a recording/reproducing film of the (SnGeSb)Te/Sb$_2$Te$_3$ superlattice phase-change memory.

First, for example, 2 V is applied to the word line WL1 connected to the gate electrode of the memory cell MC1, which is a selection cell SMC illustrated in FIG. 16, thereby setting the selection transistor ST of the selection cell SMC in an ON state. Also, for example, 0.5 V is applied upon reset operation, for example, 0.2 V is applied upon set operation, and, for example, 0.05 V is applied upon read operation, to the bit line BL1 connected to the drain region DR of the selection cell SMC via the memory unit MU. Then, the potentials of the word lines WL2, WL3, WL4, and WL5 except the word line WL1 are set at, for example, 0 V, and the potentials of the bit lines BL2, BL3, and BL4 except the bit line BL1 are set at, for example, 0 V.

Here, in the selection cell SMC, since the selection transistor ST is in an ON state, a current flows through the recording/reproducing film of the memory unit MU. Upon reset operation, the atom arrangement or the atom position of the recording/reproducing film is changed by the current flowing through the recording/reproducing film of the selection cell SMC (a programming current for reset operation). As a result, by changing the resistance value of the recording/reproducing film to a high-resistance state, the reset operation is completed.

On the other hand, upon set operation, the atom arrangement or the atom position of the recording/reproducing film is changed by the current flowing through the recording/reproducing film of the selection cell SMC (a programming current for set operation). As a result, by changing the resistance value of the recording/reproducing film to a low-resistance state, the set operation is completed. Upon read operation, information is read by determining a value of the current flowing through the recording/reproducing film of the selection cell SMC.

By contrast, in a memory cell connected to any of the bit lines BL2, BL3, and BL4 and connected to the word line WL1, the potentials of the bit lines BL2, BL3, and BL4 are 0 V, and no potential difference occurs at both ends of the recording/reproducing film. Therefore, no current flows through the recording/reproducing film, and the memory cell does not operate. Also, in a memory cell connected to any of the bit lines BL1, BL2, BL3, and BL4 and connected to any of the word lines WL2, WL3, WL4, and WL5, the selection transistor is in an OFF state, and no current flows. Therefore, the memory cell does not operate. As such, in the memory cell array MA1, while the memory cells except the selection cell SMC are set in an inactive state, the target selection cell SMC is set in an active state. In this manner, reset operation, set operation, or read operation can be performed on the selection cell SMC.

In the operation of the memory cell array MA1 described above, the case is exemplarily described in which the memory cell array MA1 is used for the recording/reproducing film described in Example 1, and the voltages to be applied to the word lines WL and the bit lines BL are specifically described, by way of example. Therefore, when the memory cell array MA1 is used for any of the recording/reproducing films described in Example 2 to Example 4, specific voltage values to be applied to the word lines WL and the bit lines BL are different. However, the basic operation of the memory cell array MA1 can be performed in a manner similar to that of the operation described above.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be widely used in manufacturing field of manufacturing semiconductor recording/reproducing device including a phase-change memory. Note that, there is a strong possibility that phase-change memory of the present invention will be used in semiconductor recording/reproducing devices instead of the phase-change memory memories which are currently in practical use represented by the GST225.

What is claimed is:

1. A phase-change memory comprising a recording/reproducing film containing Sn (tin), Sb (antimony), and Te (tellurium) and also containing an element X having a bonding strength with Te stronger than a bonding strength between Sn and Te and a bonding strength between Sb and Te, wherein the recording/reproducing film has a (SnXSb)Te alloy phase, and the (SnXSb)Te alloy phase includes a self-assembled superlattice structure, wherein the recording/reproducing film is produced by alternately laminating a free layer of SnXSb and a pinned layer of $Sb_2Te_3$.

2. A phase-change memory comprising a recording/reproducing film containing Sn (tin), Sb (antimony), and Te (tellurium) and also containing an element X having a bonding strength with Te stronger than a bonding strength between Sn and Te and a bonding strength between Sb and Te, wherein the recording/reproducing film has a (SnXSb)Te alloy phase, and the (SnXSb)Te alloy phase includes a self-assembled superlattice structure, further comprising an underlayered film comprising $Sb_2Te_3$ and wherein the recording/reproducing layer is deposited directly on the underlayered film.

3. The phase-change memory according to claim 1 further comprising an underlayered film comprising $Sb_2Te_3$ and wherein the recording/reproducing layer is deposited directly on the underlayered film.

4. The phase-change memory according to claim 1, wherein the element X is any of Ge (germanium), Al (aluminum), Mn (manganese), Cr (chromium), Mo (molybdenum), Nb (niobium), V (vanadium), and Si (silicon).

* * * * *